(12) United States Patent
Ishisone et al.

(10) Patent No.: US 11,158,832 B2
(45) Date of Patent: **\*Oct. 26, 2021**

(54) LIGHT-EMITTING DEVICE WITH EXCIPLEX LIGHT-EMITTING LAYERS

(71) Applicant: Semiconductor Energy Laboratory Co., Ltd., Atsugi (JP)

(72) Inventors: Takahiro Ishisone, Kanagawa (JP); Satoshi Seo, Kanagawa (JP); Yusuke Nonaka, Kanagawa (JP); Nobuharu Ohsawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/878,759

(22) Filed: May 20, 2020

(65) Prior Publication Data

US 2020/0280013 A1    Sep. 3, 2020

Related U.S. Application Data

(63) Continuation of application No. 15/911,225, filed on Mar. 5, 2018, now Pat. No. 10,686,153, which is a
(Continued)

(30) Foreign Application Priority Data

May 13, 2014  (JP) ................................. 2014-099560
Nov. 28, 2014  (JP) ................................. 2014-241575

(51) Int. Cl.
*H01L 51/50*    (2006.01)
*H01L 51/00*    (2006.01)

(52) U.S. Cl.
CPC ...... *H01L 51/5044* (2013.01); *H01L 51/5004* (2013.01); *H01L 51/504* (2013.01);
(Continued)

(58) Field of Classification Search
CPC ........................ H01L 51/5044; H01L 51/5016
See application file for complete search history.

(56) References Cited

U.S. PATENT DOCUMENTS

| 6,995,509 B2 | 2/2006 | Yamazaki et al. |
| 7,009,338 B2 | 3/2006 | D'Andrade et al. |

(Continued)

FOREIGN PATENT DOCUMENTS

| CN | 001790768 A | 6/2006 |
| CN | 101667628 A | 3/2010 |

(Continued)

OTHER PUBLICATIONS

Yersin.H et al., Highly Efficient OLEDs with Phosphorescent Materials, 2008, pp. 1-97,283-309.
(Continued)

*Primary Examiner* — Thao X Le
*Assistant Examiner* — Laura M Dykes
(74) *Attorney, Agent, or Firm* — Fish & Richardson P.C.

(57) ABSTRACT

Provided is a light-emitting element which includes a first electrode, a second electrode over the first electrode, and first and second light-emitting layers therebetween. The first light-emitting layer contains a first host material and a first light-emitting material, and the second light-emitting layer contains a second host material and a second light-emitting material. The first light-emitting material is a fluorescent material, and the second light-emitting material is a phosphorescent material. The level of the lowest triplet excited state ($T_1$ level) of the first light-emitting material is higher than the $T_1$ level of the first host material. A light-emitting device, an electronic device, and a lighting device including the light-emitting element are further provided.

11 Claims, 17 Drawing Sheets

Related U.S. Application Data continuation of application No. 14/709,008, filed on May 11, 2015, now abandoned.

(52) U.S. Cl.
CPC ........ *H01L 51/006* (2013.01); *H01L 51/0085* (2013.01); *H01L 51/5016* (2013.01); *H01L 2251/5361* (2013.01); *H01L 2251/5376* (2013.01)

(56) References Cited

U.S. PATENT DOCUMENTS

| | | | |
|---|---|---|---|
| 7,175,922 B2 | 2/2007 | Jarikov et al. | |
| 7,183,010 B2 | 2/2007 | Jarikov | |
| 7,285,907 B2 | 10/2007 | D'Andrade et al. | |
| 7,332,857 B2 | 2/2008 | Seo et al. | |
| 7,504,771 B2 | 3/2009 | Yamazaki et al. | |
| 7,597,967 B2 | 10/2009 | Kondakova et al. | |
| 7,993,760 B2 | 8/2011 | Komori et al. | |
| 8,021,574 B2 | 9/2011 | Kawamura et al. | |
| 8,025,815 B2 | 9/2011 | Kawamura et al. | |
| 8,026,660 B2 | 9/2011 | Yamazaki et al. | |
| 8,029,697 B2 | 10/2011 | Kawamura et al. | |
| 8,034,256 B2 | 10/2011 | Kawamura et al. | |
| 8,034,465 B2 | 10/2011 | Liao et al. | |
| 8,101,857 B2 | 1/2012 | Kido et al. | |
| 8,154,195 B2 | 4/2012 | Nishimura et al. | |
| 8,211,552 B2 | 7/2012 | Nishimura et al. | |
| 8,221,907 B2 | 7/2012 | Kawamura et al. | |
| 8,274,214 B2 | 9/2012 | Ikeda et al. | |
| 8,294,142 B2 | 10/2012 | Nishimura et al. | |
| 8,299,456 B2 | 10/2012 | Seo et al. | |
| 8,330,350 B2 | 12/2012 | Nishimura et al. | |
| 8,436,343 B2 | 5/2013 | Nishimura et al. | |
| 8,476,823 B2 | 7/2013 | Kuma et al. | |
| 8,568,903 B2 | 10/2013 | Kawamura et al. | |
| 8,587,192 B2 | 11/2013 | Nishimura et al. | |
| 8,624,484 B2 | 1/2014 | Yamazaki et al. | |
| 8,710,495 B2 | 4/2014 | Seo et al. | |
| 8,723,025 B2 | 5/2014 | Kido et al. | |
| 8,779,655 B2 | 7/2014 | Nishimura et al. | |
| 8,786,184 B2 | 7/2014 | Yamazaki et al. | |
| 8,803,420 B2 | 8/2014 | Kawamura et al. | |
| 8,847,218 B2 | 9/2014 | Nishimura et al. | |
| 8,853,680 B2 | 10/2014 | Yamazaki et al. | |
| 8,921,549 B2 | 12/2014 | Inoue et al. | |
| 8,941,297 B2 | 1/2015 | Kaiser et al. | |
| 8,963,127 B2 | 2/2015 | Pieh et al. | |
| 8,981,355 B2 | 3/2015 | Seo | |
| 8,993,129 B2 | 3/2015 | Endo et al. | |
| 8,994,263 B2 | 3/2015 | Shitagaki et al. | |
| 9,054,317 B2 | 6/2015 | Monkman et al. | |
| 9,059,430 B2 | 6/2015 | Seo et al. | |
| 9,082,994 B2 | 7/2015 | Watabe et al. | |
| 9,082,995 B2 | 7/2015 | Nishimura et al. | |
| 9,153,790 B2 | 10/2015 | Kuma et al. | |
| 9,159,942 B2 | 10/2015 | Seo et al. | |
| 9,175,213 B2 | 11/2015 | Seo et al. | |
| 9,263,693 B2 | 2/2016 | Seo et al. | |
| 9,356,250 B2 | 5/2016 | Ohsawa et al. | |
| 9,412,953 B2 | 8/2016 | Inoue et al. | |
| 9,590,208 B2 | 3/2017 | Seo et al. | |
| 9,604,928 B2 | 3/2017 | Shitagaki et al. | |
| 9,634,279 B2 | 4/2017 | Seo et al. | |
| 9,812,661 B2 | 11/2017 | Kuma et al. | |
| 10,020,451 B2 | 7/2018 | Inoue et al. | |
| 10,062,867 B2 | 8/2018 | Seo et al. | |
| 10,367,160 B2 | 7/2019 | Seo et al. | |
| 10,573,829 B2 | 2/2020 | Shitagaki et al. | |
| 10,586,934 B2 | 3/2020 | Shitagaki et al. | |
| 10,593,895 B2 | 3/2020 | Shitagaki et al. | |
| 10,978,661 B2 | 4/2021 | Seo et al. | |
| 2003/0175553 A1 | 9/2003 | Thompson et al. | |
| 2004/0227460 A1 | 11/2004 | Liao et al. | |
| 2005/0048310 A1 | 3/2005 | Cocchi et al. | |
| 2005/0221116 A1 | 10/2005 | Cocchi et al. | |
| 2006/0003184 A1* | 1/2006 | Hatwar | H01L 51/0052 428/690 |
| 2006/0134464 A1 | 6/2006 | Nariyuki | |
| 2006/0158104 A1 | 7/2006 | Iijima et al. | |
| 2006/0279203 A1 | 12/2006 | Forrest et al. | |
| 2007/0090756 A1 | 4/2007 | Okada et al. | |
| 2008/0102310 A1* | 5/2008 | Thompson | H01L 51/5036 428/690 |
| 2008/0203406 A1 | 8/2008 | He et al. | |
| 2008/0286610 A1 | 11/2008 | Deaton et al. | |
| 2009/0045731 A1 | 2/2009 | Nishimura et al. | |
| 2009/0160324 A1 | 6/2009 | Nomura et al. | |
| 2010/0051968 A1* | 3/2010 | Seo | H01L 51/5036 257/87 |
| 2010/0171109 A1 | 7/2010 | Nishimura et al. | |
| 2010/0194270 A1 | 8/2010 | Kawamura et al. | |
| 2010/0295444 A1* | 11/2010 | Kuma | H05B 33/10 313/504 |
| 2010/0295445 A1 | 11/2010 | Kuma et al. | |
| 2010/0331585 A1 | 12/2010 | Kawamura et al. | |
| 2011/0309337 A1 | 12/2011 | Nishimura et al. | |
| 2012/0126205 A1 | 5/2012 | Kawamura et al. | |
| 2012/0126208 A1 | 5/2012 | Kawamura et al. | |
| 2012/0126209 A1 | 5/2012 | Kawamura et al. | |
| 2012/0205632 A1 | 8/2012 | Shitagaki et al. | |
| 2012/0217487 A1 | 8/2012 | Yamazaki et al. | |
| 2012/0235127 A1 | 9/2012 | Takasu et al. | |
| 2012/0274201 A1 | 11/2012 | Seo et al. | |
| 2013/0049579 A1 | 2/2013 | Kaiser et al. | |
| 2013/0153871 A1* | 6/2013 | Ma | H01L 51/56 257/40 |
| 2013/0306957 A1 | 11/2013 | Mizuki et al. | |
| 2014/0070194 A1 | 3/2014 | Lai | |
| 2014/0084269 A1* | 3/2014 | Weaver | H01L 51/52 257/40 |
| 2014/0084274 A1 | 3/2014 | Yamazaki et al. | |
| 2014/0131681 A1 | 5/2014 | Ito et al. | |
| 2014/0246071 A1 | 9/2014 | Kido et al. | |
| 2014/0264308 A1 | 9/2014 | Yamazaki et al. | |
| 2014/0291646 A1 | 10/2014 | Shin et al. | |
| 2014/0339522 A1 | 11/2014 | Nonaka et al. | |
| 2014/0346479 A1 | 11/2014 | Kido et al. | |
| 2015/0053958 A1 | 2/2015 | Ishisone et al. | |
| 2015/0069352 A1 | 3/2015 | Kim et al. | |
| 2015/0155510 A1 | 6/2015 | Kawata et al. | |
| 2015/0155511 A1 | 6/2015 | Ohsawa et al. | |
| 2017/0179411 A1 | 6/2017 | Shitagaki et al. | |
| 2018/0269410 A1 | 9/2018 | Shitagaki et al. | |
| 2019/0173038 A1 | 6/2019 | Seo et al. | |
| 2020/0194692 A1 | 6/2020 | Shitagaki et al. | |

FOREIGN PATENT DOCUMENTS

| | | |
|---|---|---|
| CN | 101681996 A | 3/2010 |
| CN | 102884649 A | 1/2013 |
| DE | 102010020044 | 11/2011 |
| DE | 112012000828 | 12/2013 |
| DE | 112012001364 | 12/2013 |
| EP | 1202608 A | 5/2002 |
| EP | 1670083 A | 6/2006 |
| EP | 2147472 A | 1/2010 |
| EP | 2166585 A | 3/2010 |
| EP | 2166586 A | 3/2010 |
| EP | 2166587 A | 3/2010 |
| EP | 2166588 A | 3/2010 |
| EP | 2166589 A | 3/2010 |
| EP | 2166590 A | 3/2010 |
| EP | 2166591 A | 3/2010 |
| EP | 2434558 A | 3/2012 |
| EP | 2434559 A | 3/2012 |
| EP | 2525425 A | 11/2012 |
| EP | 2645443 A | 10/2013 |
| JP | 2003-264086 A | 9/2003 |
| JP | 2004-522276 | 7/2004 |
| JP | 2006-024791 A | 1/2006 |
| JP | 2006-172762 A | 6/2006 |
| JP | 2008-288344 A | 11/2008 |

(56) References Cited

FOREIGN PATENT DOCUMENTS

| | | |
|---|---|---|
| JP | 2009-129711 A | 6/2009 |
| JP | 2010-080436 A | 4/2010 |
| JP | 2011-192829 A | 9/2011 |
| JP | 2012-186461 A | 9/2012 |
| JP | 2012-212879 A | 11/2012 |
| JP | 2013-515361 | 5/2013 |
| JP | 2013-526773 | 6/2013 |
| JP | 2013-219024 A | 10/2013 |
| JP | 2014-007397 A | 1/2014 |
| JP | 2014-022100 A | 2/2014 |
| JP | 2014-045176 A | 3/2014 |
| JP | 2014-082235 A | 5/2014 |
| KR | 2006-0066644 A | 6/2006 |
| KR | 2010-0031723 A | 3/2010 |
| KR | 2013-0107206 A | 10/2013 |
| WO | WO-2008/143796 | 11/2008 |
| WO | WO-2009/008346 | 1/2009 |
| WO | WO-2009/008349 | 1/2009 |
| WO | WO-2010/134350 | 11/2010 |
| WO | WO-2010/134352 | 11/2010 |
| WO | WO-2011/076323 | 6/2011 |
| WO | WO-2011/086941 | 7/2011 |
| WO | WO-2011/141109 | 11/2011 |
| WO | WO-2012/070227 | 5/2012 |
| WO | WO-2012/099241 | 7/2012 |
| WO | WO-2012/111579 | 8/2012 |
| WO | WO-2012/127990 | 9/2012 |
| WO | WO-2013/090355 | 6/2013 |
| WO | WO-2013/137088 | 9/2013 |

OTHER PUBLICATIONS

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(Flrpic):Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

German Office Action (Application No. 102015208656.9) dated Apr. 27, 2021.

* cited by examiner

LIGHT-EMITTING DEVICE WITH EXCIPLEX LIGHT-EMITTING LAYERS

CROSS-REFERENCE TO RELATED APPLICATIONS

This application is a continuation of U.S. application Ser. No. 15/911,225, filed Mar. 5, 2018, now allowed, which is a continuation of U.S. application Ser. No. 14/709,008, filed May 11, 2015, now abandoned, which claims the benefit of foreign priority applications filed in Japan as Serial No. 2014-099560 on May 13, 2014, and Serial No. 2014-241575 on Nov. 28, 2014, all of which are incorporated by reference.

BACKGROUND OF THE INVENTION

1. Field of the Invention

One embodiment of the present invention relates to a light-emitting element, and a light-emitting device, a display device, an electronic device, and a lighting device each including a light-emitting element. The technical field of one embodiment of the present invention also includes a semiconductor device including the light-emitting element and its manufacturing method.

2. Description of the Related Art

A light-emitting element in which a layer containing an organic compound is provided between a pair of electrodes and a light-emitting device including the light-emitting element are called an organic electroluminescent element and an organic electroluminescent device, respectively. Organic electroluminescent devices can be used for display devices, lighting devices, and the like (see Patent Document 1, for example).

REFERENCE

Patent Document

[Patent Document 1] United States Patent Application Publication No. 2012/0205632

SUMMARY OF THE INVENTION

An object of one embodiment of the present invention is to improve the emission efficiency of a light-emitting element. Another object of one embodiment of the present invention is to provide a light-emitting element and a semiconductor device including the light-emitting element. Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting element which includes a first electrode, a second electrode over the first electrode, a first light-emitting layer, and a second light-emitting layer. The first light-emitting layer and the second light-emitting layer are both provided between the first electrode and the second electrode and have regions which overlap with each other. The first light-emitting layer contains a first host material and a first light-emitting material, and the second light-emitting layer contains a second host material and a second light-emitting material. The first light-emitting material is a fluorescent material, and the second light-emitting material is a phosphorescent material. The level of the lowest triplet excited state ($T_1$ level) of the first light-emitting material is higher than the $T_1$ level of the first host material.

Another embodiment of the present invention is a light-emitting element which includes a first electrode, a second electrode over the first electrode, a first light-emitting unit, and a second light-emitting unit. The first light-emitting unit and the second light-emitting unit are both provided between the first electrode and the second electrode and have regions which overlap with each other. An interlayer is provided between the first light-emitting unit and the second light-emitting unit. The first light-emitting unit includes a first light-emitting layer and a second light-emitting layer which overlap with each other, and the second light-emitting unit includes a third light-emitting layer. The first light-emitting layer contains a first host material and a first light-emitting material, the second light-emitting layer contains a second host material and a second light-emitting material, and the third light-emitting layer contains a third host material and a third light-emitting material. The first light-emitting material is a fluorescent material, the second light-emitting material is a phosphorescent material, and the third light-emitting material is a fluorescent material or a phosphorescent material. The $T_1$ level of the first light-emitting material is higher than the $T_1$ level of the first host material.

In this specification and the claims, a fluorescent material refers to a material that emits light in the visible light region when the level of the lowest singlet excited state ($S_1$ level) relaxes to the ground state. A phosphorescent material refers to a material that emits light in the visible light region at room temperature when the $T_1$ level relaxes to the ground state. That is, a phosphorescent material refers to a material that can convert triplet excitation energy into visible light.

In the first light-emitting layer, the first host material is present in the highest proportion by weight; in the second light-emitting layer, the second host material; and in the third light-emitting layer, the third host material.

The $T_1$ level of the second host material is preferably higher than that of the first host material.

A region of the first light-emitting layer and a region of the second light-emitting layer may be in contact with each other.

The first light-emitting layer and the second light-emitting layer may be separated from each other. In this case, a layer in which a hole-transport material and an electron-transport material are mixed or a layer containing a bipolar material may be provided between the first light-emitting layer and the second light-emitting layer. The hole-transport material or the electron-transport material may be the same as the second host material. The bipolar material may be the same as the second host material.

The second light-emitting layer may be provided over the first light-emitting layer; alternatively, the first light-emitting layer may be provided over the second light-emitting layer.

The second light-emitting unit may be provided over the first light-emitting unit; alternatively, the first light-emitting unit may be provided over the second light-emitting unit.

One embodiment of the present invention is a light-emitting device which includes a plurality of light-emitting elements having the above structure and a transistor or a substrate.

One embodiment of the present invention is an electronic device which includes the light-emitting device having the above structure.

One embodiment of the present invention is a lighting device which includes the light-emitting device having the above structure and a housing or a support.

In this specification and the claims, a light-emitting device refers to an image display device or a light source used for an image display device. Furthermore, the category of the light-emitting device includes a module in which a connector such as a flexible printed circuit (FPC) or a tape carrier package (TCP) is attached to a light-emitting device, a module in which a printed wiring board is provided on the tip of a TCP, and a module in which an integrated circuit (IC) is directly mounted on a light-emitting device by a chip on glass (COG) method.

According to one embodiment of the present invention, a light-emitting element, a light-emitting device, an electronic device, or a lighting device having high efficiency can be provided. Note that the description of these effects does not disturb the existence of other effects. One embodiment of the present invention does not necessarily achieve all the effects. Other effects will be apparent from and can be derived from the description of the specification, the drawings, the claims, and the like.

DETAILED DESCRIPTION OF THE INVENTION

Figure 1A:
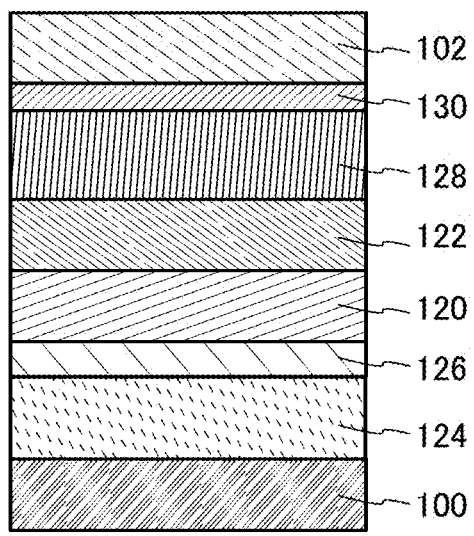
FIGS. 1A to 1D illustrate structural examples of a light-emitting element of one embodiment of the present invention.

Hereinafter, embodiments of the present invention will be described in detail with reference to the accompanying drawings. Note that the present invention is not limited to the description below, and modes and details of thereof can be modified in various ways without departing from the spirit and the scope of the present invention. Therefore, the present invention should not be construed as being limited to the description in the following embodiments.

Embodiment 1

1. Structural Example of Light-Emitting Element

A structural example of a light-emitting element of one embodiment of the present invention will be described with reference to FIG. 1A. The light-emitting element includes a first electrode 100, a second electrode 102, and a first light-emitting layer 120 and a second light-emitting layer 122 provided therebetween. The first light-emitting layer 120 and the second light-emitting layer 122 overlap with each other. In the following description, the first electrode 100 serves as an anode and the second electrode 102 serves as a cathode.

1-1. Electrode

The first electrode 100 has a function of injecting holes into the first light-emitting layer 120 and the second light-emitting layer 122, and the second electrode 102 has a function of injecting electrons into the first light-emitting layer 120 and the second light-emitting layer 122. These electrodes can be formed using a metal, an alloy, a conductive compound, a mixture or a stack of such materials, or the like. Typical examples of the metal are aluminum (Al) and silver (Ag); besides, a transition metal such as tungsten, chromium, molybdenum, copper, or titanium, an alkali metal such as lithium (Li) or cesium, or a Group 2 metal such as calcium or magnesium (Mg) can be used. As the transition metal, a rare earth metal may be used. An alloy containing any of the above metals can be used, and MgAg and AlLi can be given as examples. As the conductive compound, a metal oxide such as indium oxide-tin oxide (indium tin oxide) can be given. It is also possible to use an inorganic carbon-based material such as graphene as the conductive compound. As described above, the first electrode 100 and/or the second electrode 102 may be formed by stacking two or more of these materials.

Light emitted from the first light-emitting layer 120 and the second light-emitting layer 122 is extracted through the first electrode 100 and/or the second electrode 102. Therefore, at least one of the electrodes transmits visible light. In the case where the electrode through which light is extracted is formed using a material with low light transmittance, such as metal or alloy, the first electrode 100, the second electrode 102, or part thereof is formed to a thickness that is thin enough to transmit visible light. In this case, the specific thickness is 1 nm or more and 10 nm or less.

1-2. First Light-Emitting Layer

The first light-emitting layer 120 contains a first host material and a first light-emitting material, and the first light-emitting material is a fluorescent material. In the first light-emitting layer 120, the first host material is present in the highest proportion by weight, and the first light-emitting material is dispersed in the first host material. The $T_1$ level of the first light-emitting material is higher than the $T_1$ level of the first host material. The $S_1$ level of the first host material is preferably higher than the $S_1$ level of the first light-emitting material. The light emission mechanism of the first light-emitting layer 120 will be described later.

An anthracene derivative or a tetracene derivative is preferably used as the first host material. This is because these derivatives each have a high $S_1$ level and a low $T_1$ level. Specific examples include 9-phenyl-3-[4-(10-phenyl-9-anthryl)phenyl]-9H-carbazole (PCzPA), 3-[4-(1-naphthyl)-phenyl]-9-phenyl-9H-carbazole (PCPN), 9-[4-(10-phenyl-9-anthracenyl)phenyl]-9H-carbazole (CzPA), 7-[4-(10-phenyl-9-anthryl)phenyl]-7H-dibenzo[c,g]carbazole (cgDBCzPA), 6-[3-(9,10-diphenyl-2-anthryl)phenyl]-benzo[b]naphtho[1,2-d]furan (2mBnfPPA), and 9-phenyl-10-{4-(9-phenyl-9H-fluoren-9-yl)biphenyl-4'-yl}anthracene (FLPPA). Besides, 5,12-diphenyltetracene, 5,12-bis(biphenyl-2-yl)tetracene, and the like can be given.

Examples of the first light-emitting material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (1,6mMemFLPAPm), N,N'-bis[4-(9-phenyl-9H-fluoren-9-yl)phenyl]-N,N'-diphenylpyrene-1,6-diamine (1,6FLPAPrn), N,N'-bis(dibenzofuran-2-yl)-N,N'-diphenylpyrene-1,6-diamine (1,6FrAPm), and N,N'-bis(dibenzothiophen-2-yl)-N,N'-diphenylpyrene-1,6-diamine (1,6ThAPrn).

1-3. Second Light-Emitting Layer

The second light-emitting layer 122 contains a second host material and a second light-emitting material, and the second light-emitting material is a phosphorescent material.

In the second light-emitting layer 122, the second host material is present in the highest proportion by weight, and the second light-emitting material is dispersed in the second host material. The $T_1$ level of the second host material is preferably higher than the $T_1$ level of the second light-emitting material.

As the second light-emitting material, an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. As the metal complex, a platinum complex having a porphyrin ligand or the like can be given.

Examples of the second host material include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples are an aromatic amine and a carbazole derivative.

The second light-emitting layer 122 may further contain an additive which can form an exciplex (i.e., a heteroexcimer) together with the second host material. In this case, it is preferable that the second host material, the additive, and the second light-emitting material be selected so that the emission peak of the exciplex overlaps with an absorption band, specifically an absorption band on the longest wavelength side, of a triplet metal-to-ligand charge transfer (MLCT) transition of the second light-emitting material. This makes it possible to provide a light-emitting element with drastically improved emission efficiency.

There is no limitation on the emission colors of the first light-emitting material and the second light-emitting material, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the first light-emitting material is preferably shorter than that of the second light-emitting material. For example, it is preferable that the first light-emitting material emit blue light and that the second light-emitting material emit green, yellow, or red light.

The second light-emitting layer 122 may have a structure in which a plurality of layers is stacked. In this case, different structures or different materials may be used for the plurality of layers.

Note that the first light-emitting layer 120 and the second light-emitting layer 122 can be formed by an evaporation method (including a vacuum evaporation method), an inkjet method, a coating method, gravure printing, or the like.

1-4. Other Layers

As illustrated in FIG. 1A, the light-emitting element of one embodiment of the present invention may include another layer besides the first light-emitting layer 120 and the second light-emitting layer 122. For example, the light-emitting element may include a hole-injection layer, a hole-transport layer, an electron-blocking layer, a hole-blocking layer, an electron-transport layer, or an electron-injection layer. Furthermore, each of these layers may be formed of a plurality of layers. These layers can reduce a carrier injection barrier, improve the carrier transport property, or suppress a quenching phenomenon by an electrode, thereby contributing to an improvement in emission efficiency or a reduction in drive voltage. The light-emitting element in FIG. 1A includes a hole-injection layer 124, a hole-transport layer 126, an electron-transport layer 128, and an electron-injection layer 130 besides the first light-emitting layer 120 and the second light-emitting layer 122. In this specification and the claims, all layers provided between the first electrode 100 and the second electrode 102 are collectively defined as an EL layer. For example, in FIG. 1A, a stack including the hole-injection layer 124, the hole-transport layer 126, the first light-emitting layer 120, the second light-emitting layer 122, the electron-transport layer 128, and the electron-injection layer 130 corresponds to an EL layer.

1-4-1. Hole-Injection Layer

The hole-injection layer 124 has a function of reducing a barrier for hole injection from the first electrode 100 to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, a metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is a doped polythiophene.

As the hole-injection layer 124, a mixed layer containing a hole-transport material and a material having a property of accepting electrons from the hole-transport material can also be used. Alternatively, a stack of a layer containing a material having an electron accepting property and a layer containing a hole-transport material may also be used. Electric charge can be transferred between these materials in the presence or absence of an electric field. As examples of the material having an electron accepting property, organic acceptors such as a quinodimethane derivative, a chloranil derivative, and a hexaazatriphenylene derivative can be given. A specific example is a material having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1 \times 10^{-6}$ $cm^2/Vs$ or higher is preferable. Specifically, an aromatic amine, a carbazole derivative, an aromatic hydrocarbon, a stilbene derivative, or the like can be used. Furthermore, the hole-transport material may be a high molecular compound.

1-4-2. Hole-Transport Layer

The hole-transport layer 126 is a layer containing a hole-transport material and can be formed using any of the materials given as examples of the material of the hole-injection layer 124. In order that the hole-transport layer 126 has a function of transporting holes injected into the hole-injection layer 124 to the first light-emitting layer 120, the highest occupied molecular orbital (HOMO) level of the hole-transport layer 126 is preferably equal or close to the HOMO level of the hole-injection layer 124.

1-4-3. Electron-Injection Layer

The electron-injection layer 130 has a function of reducing a barrier for electron injection from the second electrode 102 to promote electron injection and can be formed using a Group 1 metal or a Group 2 metal, or an oxide, a halide, or a carbonate of the metal, for example. Alternatively, a mixed layer containing an electron-transport material (described later) and a material having a property of donating electrons to the electron-transport material can also be used.

As the material having an electron donating property, a Group 1 metal, a Group 2 metal, an oxide of the metal, or the like can be given.

1-4-4. Electron-Transport Layer

The electron-transport layer 128 has a function of transporting, to the second light-emitting layer 122, electrons injected from the second electrode 102 through the electron-injection layer 130. A material having a property of transporting more electrons than holes can be used as an electron-transport material, and a material having an electron mobility of $1 \times 10^{-6}$ $cm^2/Vs$ or higher is preferable. Specific examples include a metal complex having a quinoline ligand, a benzoquinoline ligand, an oxazole ligand, or a thiazole ligand; an oxadiazole derivative; a triazole derivative; a phenanthroline derivative; a pyridine derivative; and a bipyridine derivative.

Note that the hole-injection layer 124, the hole-transport layer 126, the electron-injection layer 130, and the electron-transport layer 128 described above can each be formed by an evaporation method (including a vacuum evaporation method), an inkjet method, a coating method, a gravure printing method, or the like.

Besides the above-mentioned materials, an inorganic compound or a high molecular compound (e.g., an oligomer, a dendrimer, or a polymer) may be used for the hole-injection layer 124, the hole-transport layer 126, the electron-injection layer 130, and the electron-transport layer 128.

2. Another Structural Example of Light-Emitting Element

Figure 1B:
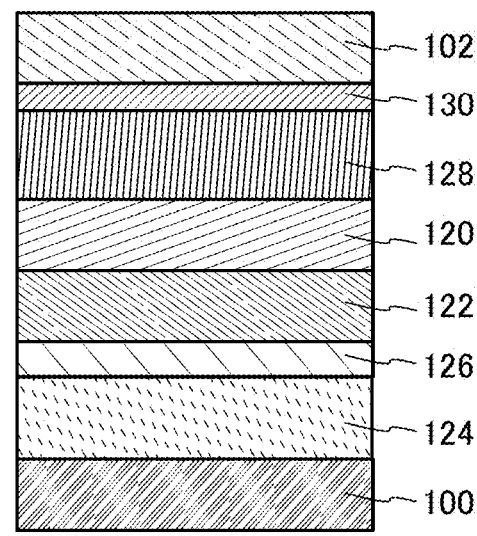

In the light-emitting element in FIG. 1A, the second light-emitting layer 122 is provided over the first light-emitting layer 120; however, one embodiment of the present invention is not limited to this structure. As illustrated in FIG. 1B, the first light-emitting layer 120 may be positioned over the second light-emitting layer 122.

3. Light Emission Mechanism of First Light-Emitting Layer 120

Figure 2:
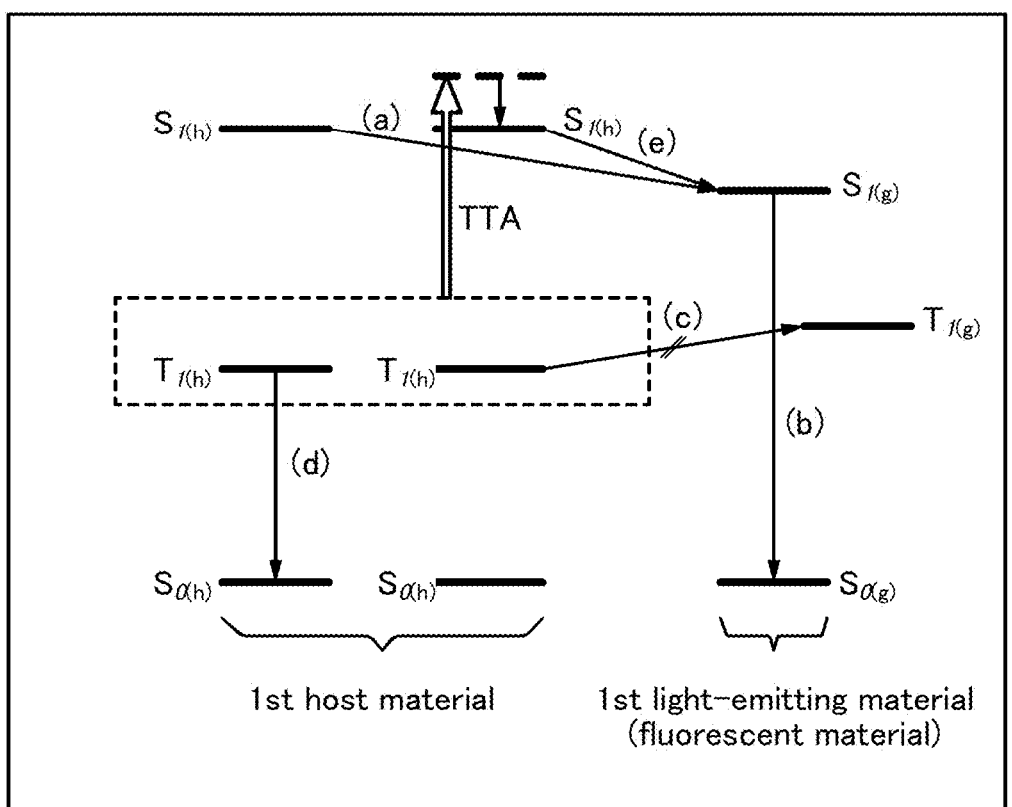
FIG. 2 illustrates a light emission mechanism of a light-emitting element of one embodiment of the present invention.

FIG. 2 illustrates a correlation between energy levels of the first host material and the first light-emitting material. The symbols in FIG. 2 denote as follows:

$S_{0(h)}$: the level of the ground state of the first host material;

$S_{0(g)}$: the level of the ground state of the first light-emitting material;

$S_{1(h)}$: the level of the lowest singlet excited state of the first host material;

$S_{1(g)}$: the level of the lowest singlet excited state of the first light-emitting material;

$T_{1(h)}$: the level of the lowest triplet excited state of the first host material; and $T_{1(g)}$: the level of the lowest triplet excited state of the first light-emitting material.

As described above, the first light-emitting layer 120 contains the first host material and the first light-emitting material whose $T_1$ level is higher than that of the first host material. That is, $T_{1(g)}$ is higher than $T_{1(h)}$. Furthermore, in the first light-emitting layer 120, the first host material is present in a larger amount than the first light-emitting material. FIG. 2 shows the energy levels of two molecules of the first host material and one molecule of the first light-emitting material.

In the first light-emitting layer 120, excited states are formed by carrier recombination. Since the first host material is present in a larger amount than the first light-emitting material, most of the excited states are excited states of the first host material. Here, the ratio of the singlet excited state to the triplet excited state produced by carrier recombination (hereinafter, excitors generation probability) is approximately 1:3. That is, the singlet excited state with $S_{1(h)}$ and the triplet excited state with $T_{1(h)}$ are generated in the proportion of approximately 1 to 3.

In the case where $S_{1(g)}$ is lower than $S_{1(h)}$, light emission can be obtained in the following manner: energy is rapidly transferred from the first host material in the singlet excited state to the first light-emitting material (singlet energy transfer: Process (a)), a singlet excited state of the first light-emitting material is produced, and the singlet excited state relaxes to the ground state through a radiative process (Process (b)). Here, if $T_{1(h)}$ is higher than $T_{1(g)}$, energy is rapidly transferred from the first host material in the triplet excited state to the first light-emitting material (triplet energy transfer), so that a triplet excited state of the first light-emitting material is formed. However, since the first light-emitting material is a fluorescent material, its triplet excited state does not provide light emission in the visible light region. Consequently, the triplet excited state of the first host material cannot be utilized for light emission. Thus, if $T_{1(h)}$ is higher than $T_{1(g)}$, only the light emission through Process (a) can be used; as a result, no more than approximately 25% of injected carriers can be used for light emission.

On the other hand, in the light-emitting element of one embodiment of the present invention, $T_{1(g)}$ is higher than $T_{1(h)}$ as shown in FIG. 2. Therefore, triplet energy transfer (Process (c)) from the first host material to the first light-emitting material does not occur or is negligible. In this case, as for the triplet state of the first host material, a relaxation process (Process (d)) to the ground state through a non-radiative process competes against a process through which a singlet excited state of the first host material is generated by triplet-triplet annihilation (TTA). From the singlet excited state of the first host material generated by TTA, energy is transferred to the lower level $S_{1(g)}$ (Process (e)), whereby a singlet excited state of the first light-emitting material can be produced.

In summary, in the first light-emitting layer 120, the singlet excited state of the first light-emitting material is formed through the following two processes: (1) Process (a) through which energy is transferred from the singlet excited state of the first host material generated directly by carrier recombination and (2) Process (e) through which energy is transferred from the singlet excited state of the first host material generated by TTA. As described above, if $T_{1(g)}$ is lower than $T_{1(h)}$, only the former process can be utilized, and thus, the efficiency of the light-emitting element is limited by the exciton generation probability. In contrast, in the case where $T_{1(g)}$ is higher than $T_{1(h)}$ as in the light-emitting element of one embodiment of the present invention, both the processes can be utilized; therefore, an emission efficiency exceeding the exciton generation probability can be achieved, and a light-emitting element with high efficiency can be provided.

The structures described in this embodiment can be used in appropriate combination with any of the structures described in the other embodiments.

Embodiment 2

Figure 1C:
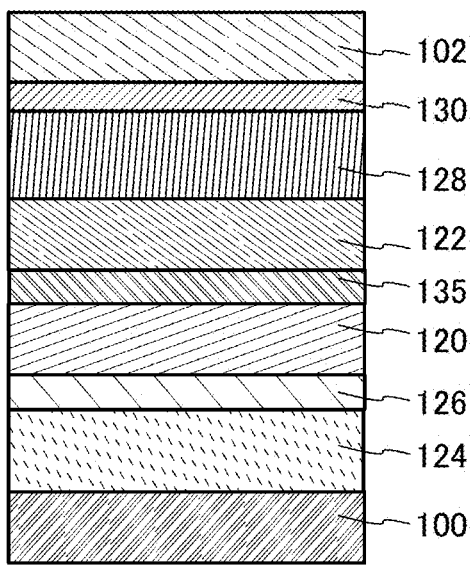

In this embodiment, a light-emitting element of one embodiment of the present invention will be described with reference to FIG. 1C. The light-emitting element in this embodiment is different from the light-emitting element in Embodiment 1 in that a separation layer 135 is provided between the first light-emitting layer 120 and the second light-emitting layer 122. The separation layer 135 is in contact with the first light-emitting layer 120 and the second light-emitting layer 122. The structures of the other layers are similar to those in Embodiment 1; therefore, description thereof is omitted.

The separation layer 135 is provided to prevent energy transfer by the Dexter mechanism (particularly triplet energy transfer) from the second host material in an excited state or the second light-emitting material in an excited state which is generated in the second light-emitting layer 122 to the first host material or the first light-emitting material in the first light-emitting layer 120. Therefore, the thickness of the separation layer may be approximately several nanometers, specifically 0.1 nm or more and 20 nm or less, 1 nm or more and 10 nm or less, or 1 nm or more and 5 nm or less.

The separation layer 135 may contain a single material or both a hole-transport material and an electron-transport material. In the case of a single material, a bipolar material may be used. The bipolar material here refers to a material in which the ratio between the electron mobility and the hole mobility is 100 or less. As a material contained in the separation layer 135, the hole-transport material, the electron-transport material, or the like given as an example in Embodiment 1 can be used. Furthermore, at least one of materials contained in the separation layer 135 may be the same as the second host material. This facilitates the manufacture of the light-emitting element and reduces the drive voltage.

Alternatively, at least one of materials contained in the separation layer 135 may have a higher $T_1$ level than the second host material.

The recombination region can be adjusted by adjusting the mixed ratio of the hole-transport material and the electron-transport material in the separation layer 135, whereby the emission color can be controlled. For example, in the case where the first electrode 100 and the second electrode 102 serve as an anode and a cathode, respectively, the recombination region can be shifted from the first electrode 100 side to the second electrode 102 side by increasing the proportion of the hole-transport material in the separation layer 135. As a result, the contribution of the second light-emitting layer 122 to light emission can be increased. In contrast, by increasing the proportion of the electron-transport material in the separation layer 135, the recombination region can be shifted from the second electrode 102 side to the first electrode 100 side, so that the contribution of the first light-emitting layer 120 to light emission can be increased. In the case where the first light-emitting layer 120 and the second light-emitting layer 122 have different emission colors, the emission color of the light-emitting element as a whole can be changed by adjusting the recombination region.

The hole-transport material and the electron-transport material may form an exciplex in the separation layer 135, which effectively prevents exciton diffusion. Specifically, energy transfer from the second host material in an excited state or the second light-emitting material in an excited state to the first host material or the first light-emitting material can be prevented.

Figure 1D:
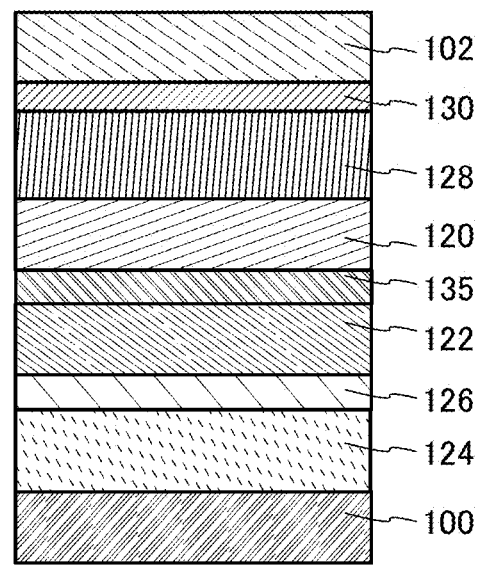

As in the light-emitting element described in Embodiment 1, the first light-emitting layer 120 may be positioned over the second light-emitting layer 122 as illustrated in FIG. 1D. In this case, the second light-emitting layer 122 is provided over the hole-transport layer 126, and the first light-emitting layer 120 is provided over the second light-emitting layer 122 with the separation layer 135 interposed therebetween.

The structures described in this embodiment can be used in appropriate combination with any of the structures described in the other embodiments.

Embodiment 3

In this embodiment, a light-emitting element of one embodiment of the present invention will be described with reference to FIG. 3A.

1. Structural Example of Light-Emitting Element

Figure 3A:
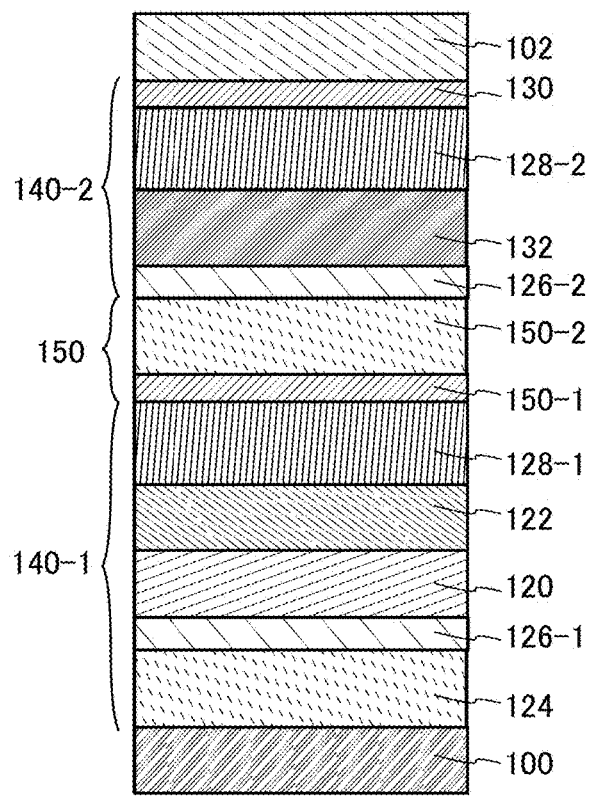
FIGS. 3A to 3C illustrate structural examples of a light-emitting element of one embodiment of the present invention.

As illustrated in FIG. 3A, the light-emitting element in this embodiment includes the first electrode 100, the second electrode 102, and a first light-emitting unit 140-1 and a second light-emitting unit 140-2 provided therebetween. The first light-emitting unit 140-1 and the second light-emitting unit 140-2 overlap with each other with an interlayer 150 provided therebetween. In the following description, the first electrode 100 serves as an anode and the second electrode 102 serves as a cathode. Components denoted by the same reference numerals or names as those in Embodiments 1 and 2, such as the first electrode 100 and the second electrode 102, are similar to those in Embodiments 1 and 2; therefore, detailed description thereof is omitted.

1-1. First Light-Emitting Unit

The first light-emitting unit 140-1 includes the first light-emitting layer 120 and the second light-emitting layer 122. The structures and materials of these layers are similar to those in Embodiment 1. Therefore, although the second light-emitting layer 122 is provided over the first light-emitting layer 120 in the light-emitting element in FIG. 3A, the first light-emitting layer 120 may be provided over the second light-emitting layer 122. As illustrated in FIG. 3A, the hole-injection layer 124, a hole-transport layer 126-1, and an electron-transport layer 128-1 may be further provided. As these layers, layers similar to the hole-injection layer 124, the hole-transport layer 126, and the electron-transport layer 128 described in Embodiment 1 can be used. Although not illustrated, the separation layer 135 may be provided between the first light-emitting layer 120 and the second light-emitting layer 122 as described in Embodiment 2.

1-2. Interlayer

The interlayer 150 has a function of injecting electrons into the first light-emitting unit 140-1 and injecting holes into the second light-emitting unit 140-2 when a voltage is applied between the first electrode 100 and the second electrode 102. In addition, it is preferable that the interlayer 150 be capable of transmitting visible light and have a visible light transmittance of 40% or higher. Here, the interlayer 150 includes a first layer 150-1 and a second layer 150-2. The first layer 150-1 is provided on the first light-emitting unit 140-1 side, and the second layer 150-2 is provided on the second light-emitting unit 140-2 side.

The first layer 150-1 can be formed using a Group 1 metal or a Group 2 metal, or a compound thereof (e.g., an oxide, a halide, or a carbonate), for example. Alternatively, a mixed layer containing the electron-transport material described in Embodiment 1 and a material having a property of donating electrons to the electron-transport material can also be used.

As the second layer 150-2, a layer containing the transition metal oxide described in Embodiment 1 can be used. It is also possible to use a mixed layer containing a hole-transport material and a material having a property of accepting electrons from the hole-transport material or a stack of a layer containing a material having an electron accepting property and a layer containing a hole-transport material. Specifically, the mixed layer or the stack which is described in Embodiment 1 and can be used as the hole-injection layer 124 can be used.

Although not illustrated, a buffer layer may be provided between the first layer 150-1 and the second layer 150-2. The buffer layer can prevent a material of the first layer 150-1 and a material of the second layer 150-2 from reacting with each other at the interface. The buffer layer contains an electron-transport material, examples of which include a perylene derivative and a nitrogen-containing condensed aromatic compound.

The interlayer 150 can be formed by an evaporation method (including a vacuum evaporation method), an inkjet method, a coating method, a gravure printing method, or the like.

1-3. Second Light-Emitting Unit

The second light-emitting unit 140-2 includes a third light-emitting layer 132. The third light-emitting layer 132 contains a third host material and a third light-emitting material, and the third light-emitting material is a fluorescent material or a phosphorescent material. In the third light-emitting layer 132, the third host material is present in the highest proportion by weight, and the third light-emitting material is dispersed in the third host material. As the third host material, a material similar to the first host material or the second host material described in Embodiment 1 can be used. The third host material may be the same as or different from the first host material or the second host material. In the case where a fluorescent material is used as the third light-emitting material, the $S_1$ level of the third host material is preferably higher than that of the third light-emitting material. In the case where a phosphorescent material is used as the third light-emitting material, on the other hand, the $T_1$ level of the third host material is preferably higher than that of the third light-emitting material. As the third light-emitting material, a material similar to the first light-emitting material or the second light-emitting material described in Embodiment 1 can be used.

The third light-emitting material may be the same as or different from the first light-emitting material or the second light-emitting material. For example, the first light-emitting material, the second light-emitting material, and the third light-emitting material are used to provide light in the three primary colors of red, blue, and green, whereby white light with high color rendering properties can be extracted from the light-emitting element.

In the light-emitting element in FIG. 3A, the second light-emitting unit 140-2 further includes a hole-transport layer 126-2, an electron-transport layer 128-2, and the electron-injection layer 130. Layers similar to those in Embodiment 1 can be used as these layers.

Although having a higher drive voltage than the light-emitting elements described in Embodiments 1 and 2, the light-emitting element described in this embodiment can have a current efficiency which is twice or more that of the light-emitting elements described in Embodiments 1 and 2 at substantially the same current density: thus, a light-emitting element with high efficiency can be achieved.

2. Another Structural Example of Light-Emitting Element

Figure 3B:
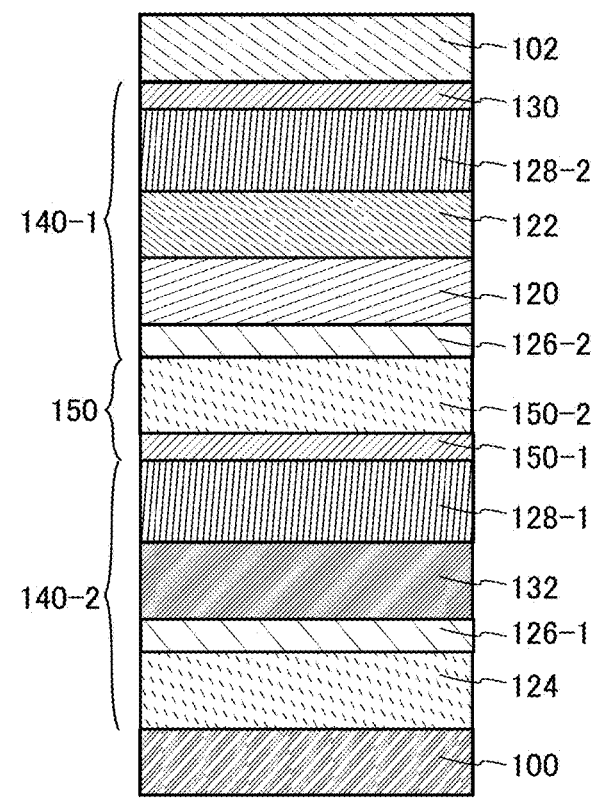

In the light-emitting element in FIG. 3A, the light-emitting unit (the first light-emitting unit 140-1) including the first light-emitting layer 120 and the second light-emitting layer 122 is formed on the first electrode 100 side; however, as illustrated in FIG. 3B, the first light-emitting unit 140-1 may be formed on the second electrode 102 side. Also in this case, the separation layer 135 may be provided between the first light-emitting layer 120 and the second light-emitting layer 122 as in Embodiment 2.

Figure 3C:
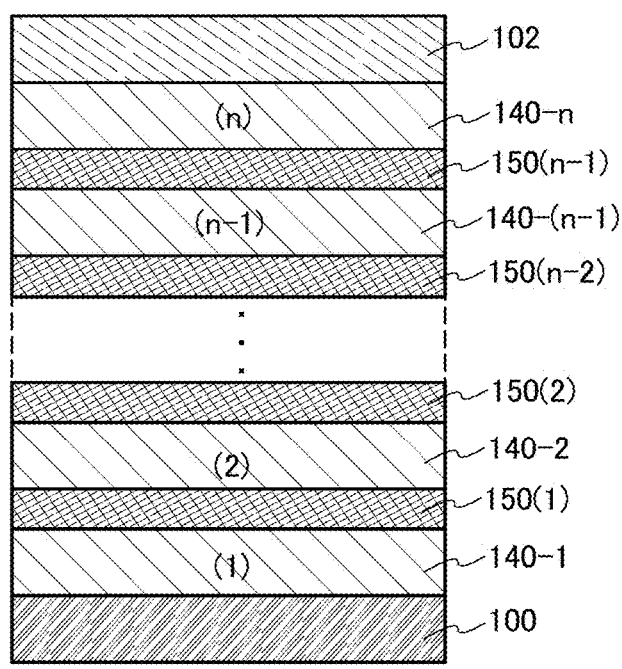

Although the light-emitting elements each including two light-emitting units are described so far with reference to FIGS. 3A and 3B, embodiments of the present invention also include a light-emitting element illustrated in FIG. 3C in which n (n is an integer of 3 or more) light-emitting units (140-1 to 140-n) are stacked. In this case, interlayers (150(1) to 150(n−1)) are provided between the respective adjacent light-emitting units. In addition, at least one of the n light-emitting units has a structure similar to that of the first light-emitting unit, and at least another one of the n light-emitting units has a structure similar to that of the second light-emitting unit.

The structures described in this embodiment can be used in appropriate combination with any of the structures described in the other embodiments.

Embodiment 4

Figure 4A:
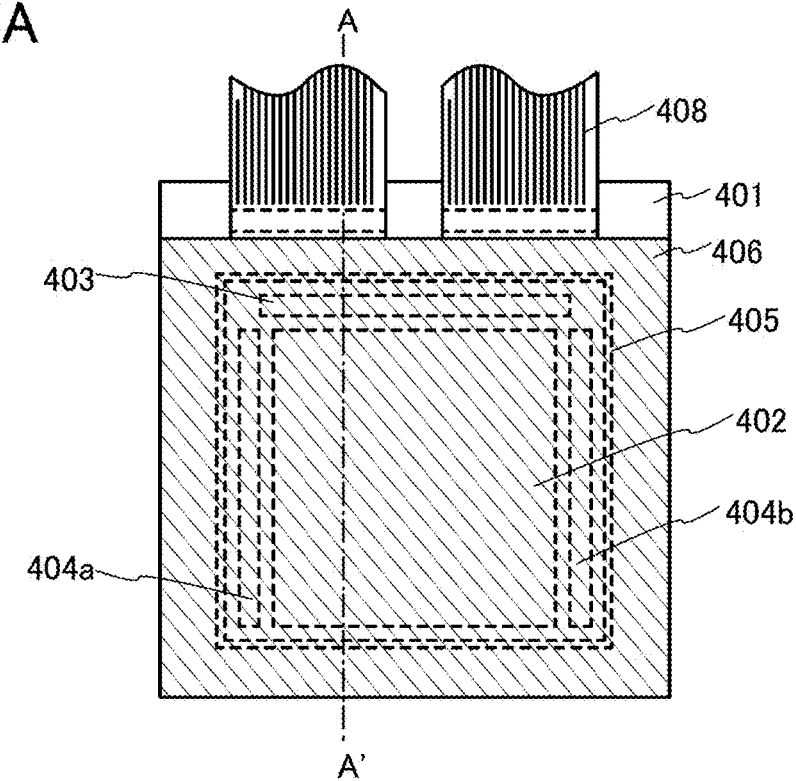
FIGS. 4A and 4B illustrate a structural example of a light-emitting device of one embodiment of the present invention.

In this embodiment, as an example of a light-emitting device including the light-emitting element of one embodiment of the present invention, an active matrix light-emitting device will be described with reference to FIGS. 4A and 4B. FIG. 4A is a top view of the light-emitting device, and FIG. 4B is a cross-sectional view taken along line A-A' in FIG. 4A.

Figure 4B:
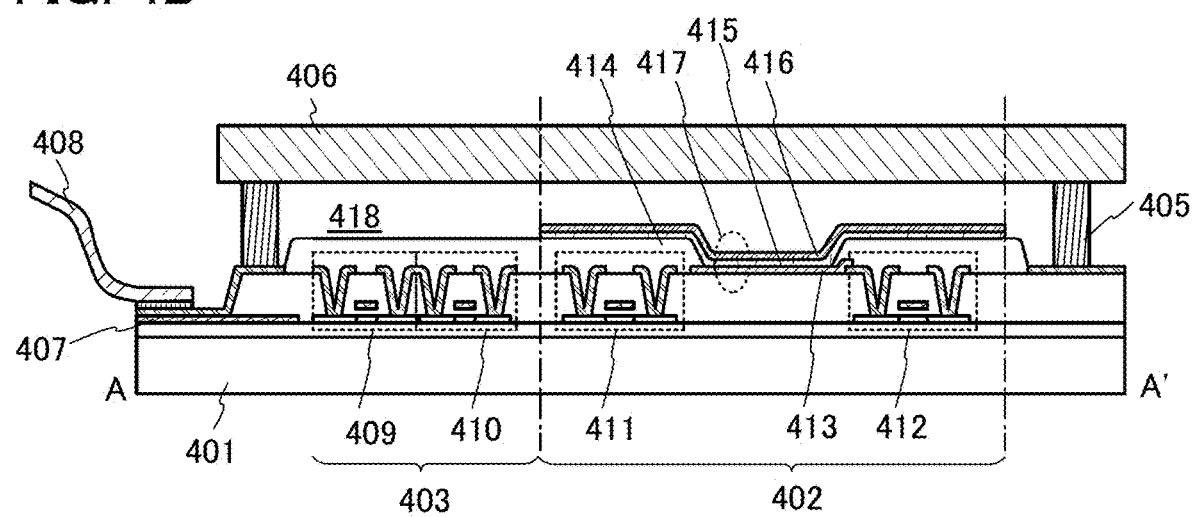

As illustrated in FIGS. 4A and 4B, the light-emitting device includes a source side driver circuit 403, a pixel portion 402, and gate side driver circuits 404a and 404b over an element substrate 401. Reference numeral 406 denotes a sealing substrate, and reference numeral 405 denotes a sealant. A region 418 is surrounded by the sealant 405. As the element substrate 401 and the sealing substrate 406, a glass substrate, a quartz substrate, or a flexible substrate formed of fiber reinforced plastic (FRP), poly(vinyl fluoride) (PVF), a polyester, an acrylic resin, or the like can be used. A wiring 407 is a lead wiring for receiving a variety of signals from an FPC 408 and transmitting them to the source side driver circuit 403 and the gate side driver circuits 404a and 404b. A printed wiring board (PWB) may be attached to the FPC.

For simplicity, FIG. 4B illustrates part of the source side driver circuit 403 and one pixel in the pixel portion 402. As illustrated in FIG. 4B, in the source side driver circuit 403, a CMOS circuit in which an n-channel transistor 409 and a p-channel transistor 410 are combined is formed; however, a circuit different from the CMOS circuit, such as a PMOS circuit or an NMOS circuit, may be provided. Furthermore, the source side driver circuit 403 and the gate side driver circuits 404a and 404b may be partly or entirely formed not over the substrate but outside the substrate. The transistors may be staggered transistors or inverted staggered transistors. A semiconductor layer for forming the transistors may be formed using any material as long as it exhibits semiconductor characteristics; for example, a Group 14 element such as silicon or germanium, a compound such as gallium arsenide or indium phosphide, or an oxide such as zinc oxide or tin oxide can be used. As the oxide exhibiting semiconductor characteristics (oxide semiconductor), a composite oxide of elements selected from indium, gallium, aluminum, zinc, and tin, or the like can be used. The semiconductor layer may be crystalline or amorphous. Specific examples of a crystalline semiconductor include a single crystal semiconductor, a polycrystalline semiconductor, and a microcrystalline semiconductor.

The pixel portion 402 includes a plurality of pixels each including a switching transistor 411, a current controlling transistor 412, and a first electrode 413 electrically connected to the current controlling transistor 412. An insulator 414 is formed to cover an end portion of the first electrode 413.

A light-emitting element 417 which has the structure of the light-emitting element described in Embodiment 1, 2, or 3 is provided in an opening portion of the insulator 414. That is, the light-emitting element 417 includes the first electrode 413, an EL layer 415, and a second electrode 416; the EL layer 415 includes at least a first light-emitting layer and a second light-emitting layer and may further include a third light-emitting layer. Note that a plurality of light-emitting elements is formed in the pixel portion 402; some of them may have a structure different from the structures of the light-emitting elements described in Embodiments 1 to 3.

The sealing substrate 406 and the element substrate 401 are bonded to each other by the sealant 405, and the light-emitting element 417 is provided in the region 418. The region 418 is filled with an inert gas or a resin and/or a drying agent. An epoxy-based resin or glass frit is preferably used as the sealant 405.

The structures described in this embodiment can be used in appropriate combination with any of the structures described in the other embodiments.

Embodiment 5

Figure 5A:
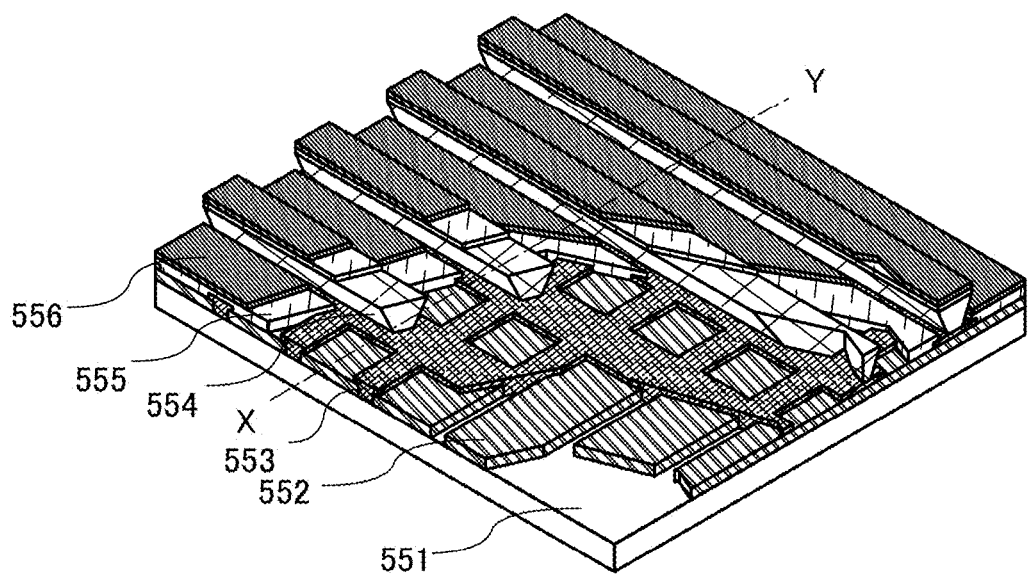
FIGS. 5A and 5B illustrate a structural example of a light-emitting device of one embodiment of the present invention.
Figure 5B:
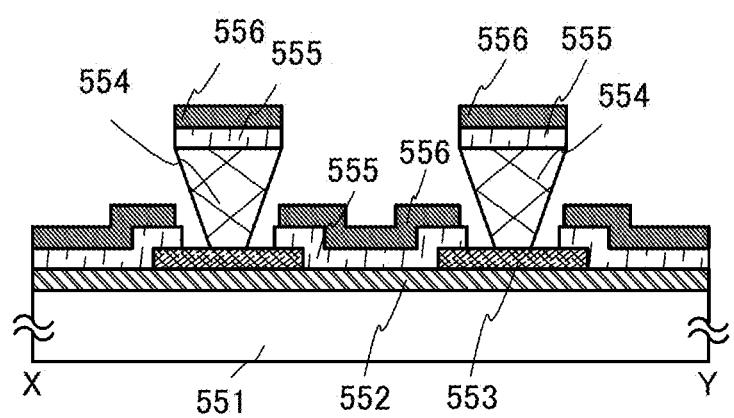

In this embodiment, as an example of a light-emitting device including the light-emitting element of one embodiment of the present invention, a passive matrix light-emitting device will be described with reference to FIGS. 5A and 5B. FIG. 5A is a perspective view of the light-emitting device, and FIG. 5B is a cross-sectional view taken along line X-Y in FIG. 5A.

The light-emitting device includes a substrate 551, a first electrode 552, a second electrode 556, and an EL layer 555, and the EL layer 555 includes the first light-emitting layer 120 and the second light-emitting layer 122 described in Embodiment 1, 2, or 3. Part of the first electrode 552 is covered with an insulating layer 553, and a partition layer 554 is provided over the insulating layer 553. The width of the partition layer 554 increases with distance from the substrate 551. In other words, a cross section of the partition layer 554 in the short side direction is trapezoidal, and the base in contact with the insulating layer 553 is shorter than the upper side. Accordingly, a defect of the light-emitting element due to crosstalk can be prevented.

The structures described in this embodiment can be used in appropriate combination with any of the structures described in the other embodiments.

Embodiment 6

In this embodiment, examples of an electronic device which includes a light-emitting device including the light-emitting element of one embodiment of the present invention will be described with reference to FIGS. 6A to 6D and FIGS. 7A and 7B.

Examples of the electronic device are a television device, a computer, a camera (a digital camera or a digital video camera), a digital photo frame, a mobile phone, a portable information terminal, a game machine, and an audio reproducing device. Specific examples of these electronic devices are illustrated in FIGS. 6A to 6D.

Figure 6A:
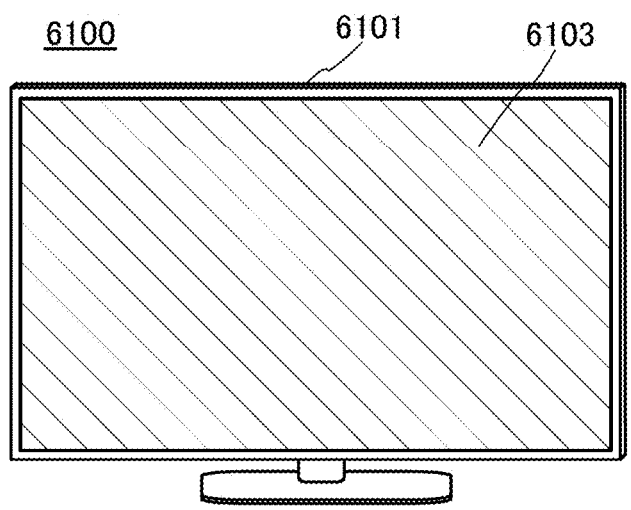
FIGS. 6A to 6D illustrate examples of an electronic device of one embodiment of the present invention.

FIG. 6A illustrates an example of a television device. In a television device 6100, a display portion 6103 is incorporated in a housing 6101. In the display portion 6103, a light-emitting device including the light-emitting element described in Embodiment 1, 2, or 3 is provided.

Figure 6B:
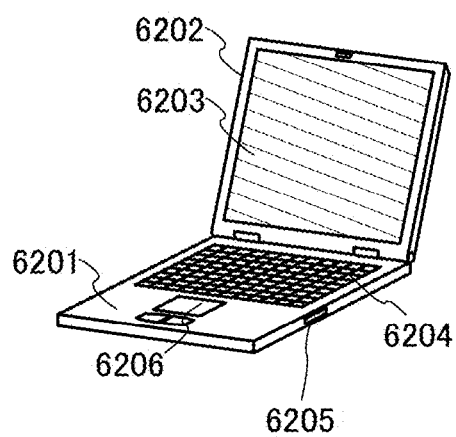

FIG. 6B illustrates an example of a computer. The computer includes a main body 6201, a housing 6202, a display portion 6203, a keyboard 6204; an external connection port 6205, a pointing device 6206, and the like. In the display portion 6203, a light-emitting device including the light-emitting element described in Embodiment 1, 2, or 3 is provided.

Figure 6C:
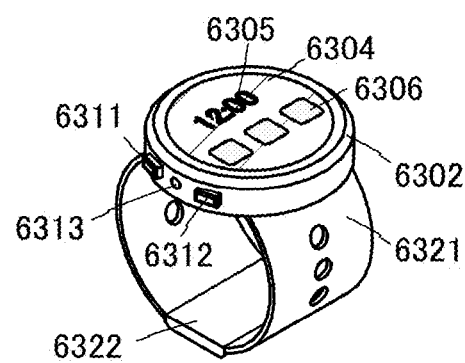

FIG. 6C illustrates an example of a smart watch. The smart watch includes a housing 6302, a display panel 6304, operation buttons 6311 and 6312, a connection terminal 6313, a band 6321, a clasp 6322, and the like. In the display panel 6304, a light-emitting device including the light-emitting element described in Embodiment 1, 2, or 3 is provided. Furthermore, the display panel 6304 has a non-rectangular display region and can display an icon 6305 indicating time, another icon 6306, and the like.

Figure 6D:
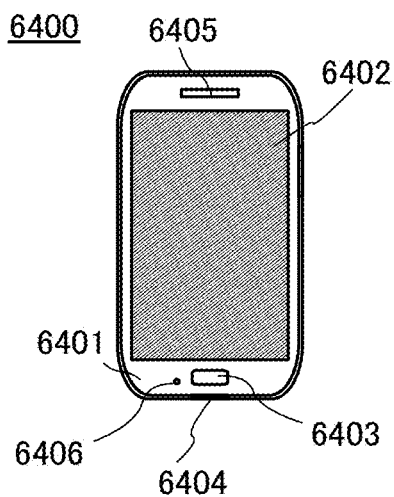

FIG. 6D illustrates an example of a mobile phone. A mobile phone 6400 is provided with a display portion 6402 incorporated in a housing 6401, an operation button 6403, an external connection port 6404, a speaker 6405, a microphone 6406, and the like. In the display portion 6402, a light-emitting device including the light-emitting element described in Embodiment 1, 2, or 3 is provided. Although not illustrated, the display portion 6402 is provided with a touch panel; when a user touches the display portion 6402 with his or her finger or the like, the user can operate the mobile phone 6400 or input data to the mobile phone 6400. An image sensor may be mounted on the display portion 6402 to provide an imaging function.

Figure 7A:
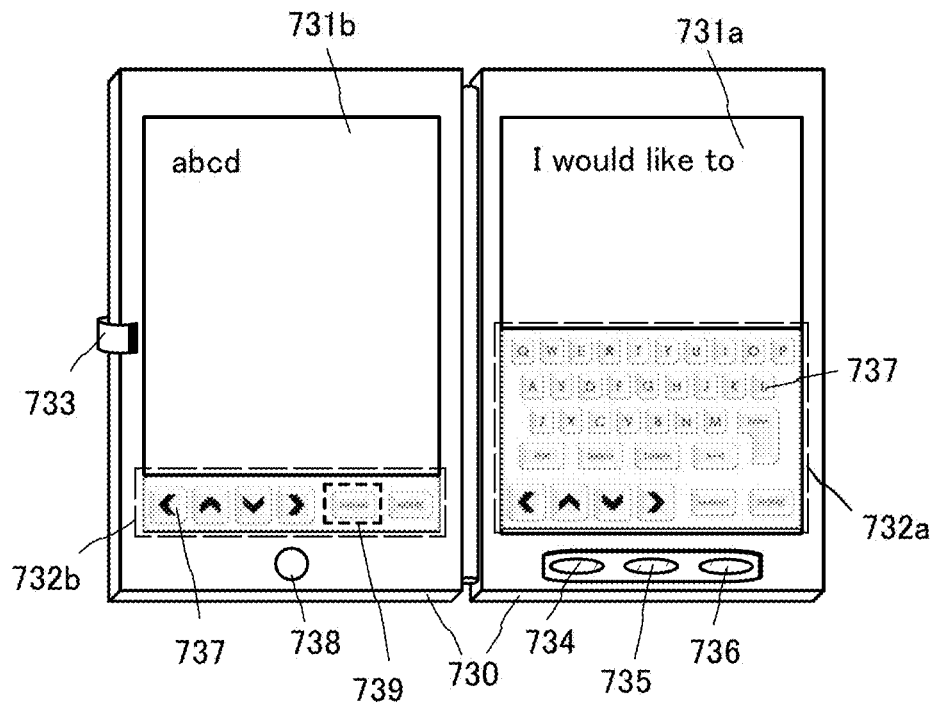
FIGS. 7A and 7B illustrate an example of an electronic device of one embodiment of the present invention.
Figure 7B:
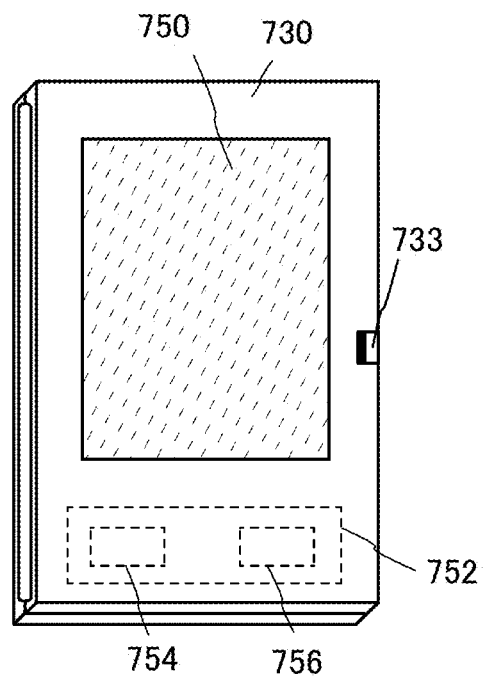

FIGS. 7A and 7B illustrate an example of a foldable tablet terminal. In FIG. 7A, the tablet terminal is open (unfolded). The tablet terminal includes a housing 730, a display portion 731a, a display portion 731b, a display mode switch 734, a power switch 735, a power-saving mode switch 736, a clasp 733, an operation switch 738, and the like. In the display portion 731a and/or the display portion 731b, a light-emitting device including the light-emitting element described in Embodiment 1, 2, or 3 is provided. By closing the housing 730 of the foldable tablet terminal when not in use, the display portion 731a and the display portion 731b can be protected.

The display portion 731a and the display portion 731b can be partly or entirely a touch panel region 732a and a touch panel region 732b, respectively, and a variety of operations such as data input may be performed by touching an operation key 737 or an operation switch 739 displayed thereon.

With the display mode switch 734, the display can be switched between a portrait mode, a landscape mode, and the like, and between monochrome display and color display, for example. With the power-saving mode switch 736, the luminance of display can be optimized in accordance with the amount of external light detected by an optical sensor incorporated in the tablet terminal.

Although having the same display area in the example in FIG. 7A, the display portion 731a and the display portion 731b may have different areas. In addition, the display portion 731a and the display portion 731b may have different display specifications; for example, one may have higher resolution than the other.

In FIG. 7B, the tablet terminal is closed (folded), and a solar cell 750, a charge and discharge control circuit 752, a battery 754, a DCDC converter 756, and the like are illustrated. The solar cell 750 can supply power to the tablet terminal. Note that the solar cell 750 may be provided on one side or both sides of the housing 730.

In the above-described manner, electronic devices can be obtained by the use of the light-emitting device of one embodiment of the present invention. The light-emitting device has a considerably wide application range and can be used for electronic devices in a variety of fields.

The structures described in this embodiment can be used in appropriate combination with any of the structures described in the other embodiments.

Embodiment 7

In this embodiment, examples of a lighting device which includes a light-emitting device including the light-emitting element of one embodiment of the present invention will be described with reference to FIG. 8.

Figure 8:
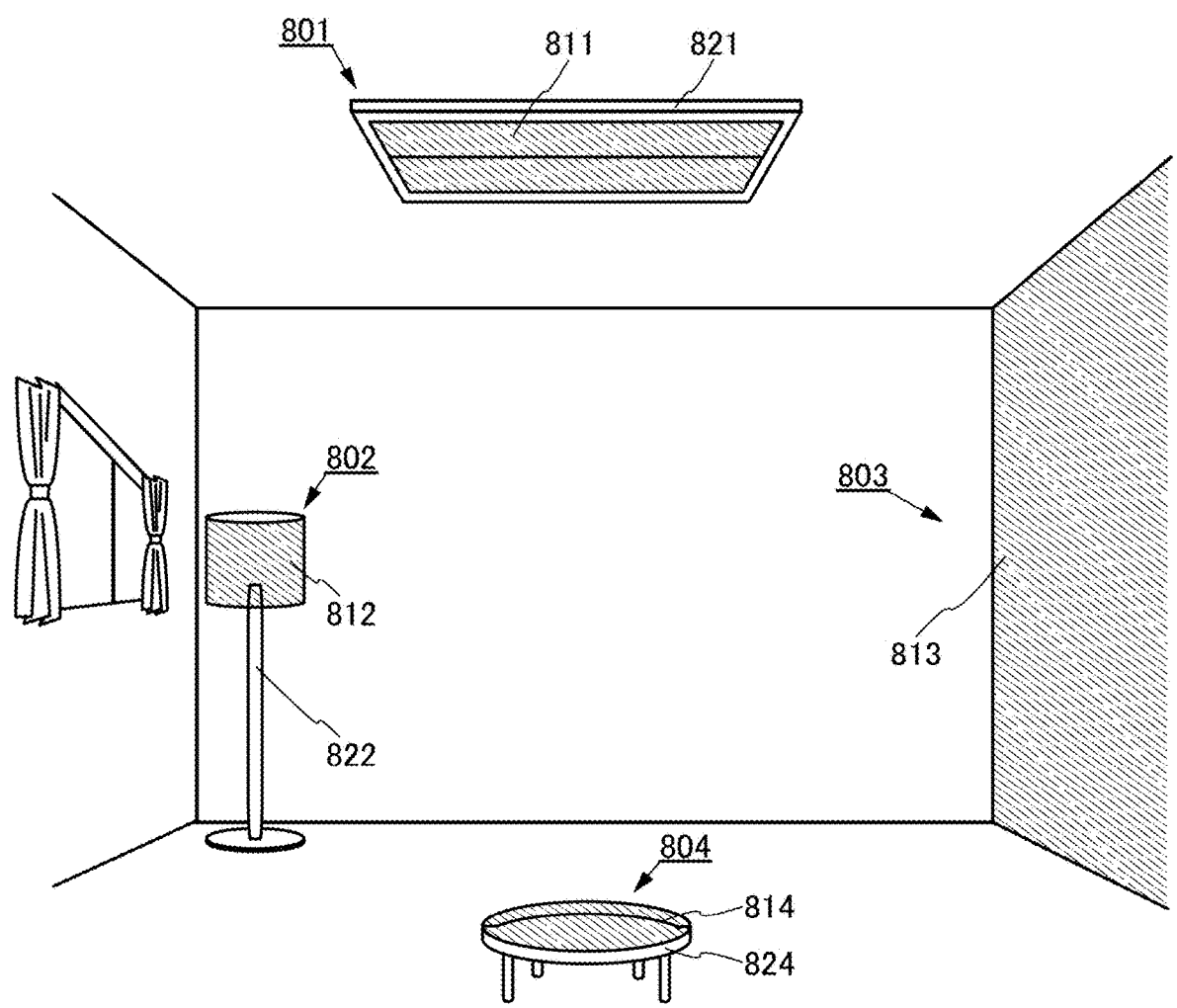
FIG. 8 illustrates examples of a lighting device of one embodiment of the present invention.

FIG. 8 illustrates a lighting device 801 on the ceiling, a lighting device 803 on the wall, a lighting device 802 on a curved surface, and a lighting device 804 on furniture such as a table. The lighting device 801 includes a housing 821 and a light-emitting device 811 provided in the housing 821. The lighting device 802 includes a support 822 and a light-emitting device 812 on the support 822. As the lighting device 803, a light-emitting device 813 is provided on the wall. The lighting device 804 includes a support 824 and a light-emitting device 814 on the support 824. The light-emitting element described in Embodiment 1, 2, or 3 can be used for the light-emitting devices included in these lighting devices.

The structures described in this embodiment can be used in appropriate combination with any of the structures described in the other embodiments.

Example 1

Figure 9A:
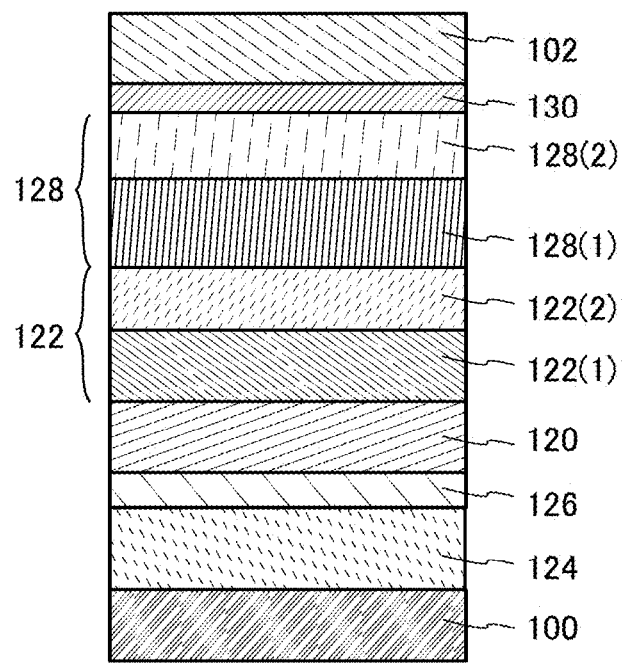
FIGS. 9A and 9B are schematic views of a light-emitting element 1 and a light-emitting element 2 in Example 1 and 2.

In this example, an example of fabricating a light-emitting element of one embodiment of the present invention will be described. FIG. 9A is a schematic view of a light-emitting element (light-emitting element 1) fabricated in this example, Table 1 shows the detailed structure of the element, and structures and abbreviations of compounds used here are given below.

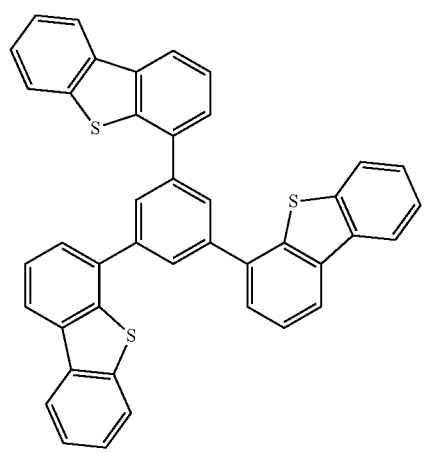

DBT3P-II

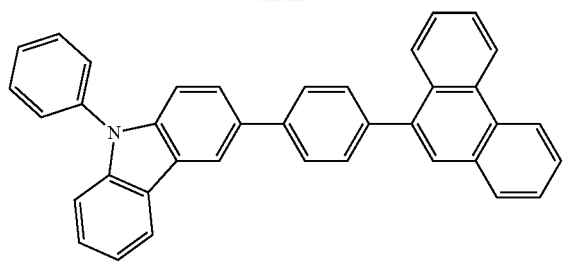
PCPPn
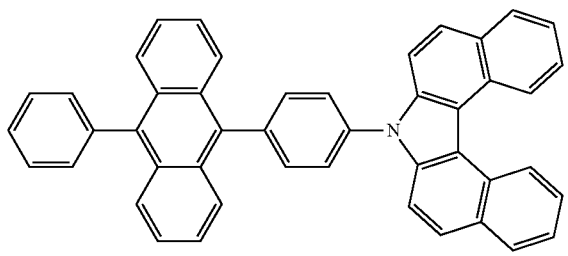
cgDBCzPA
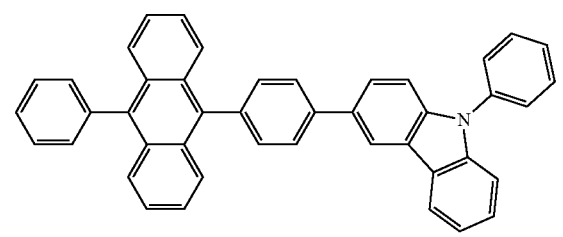
PCzPA
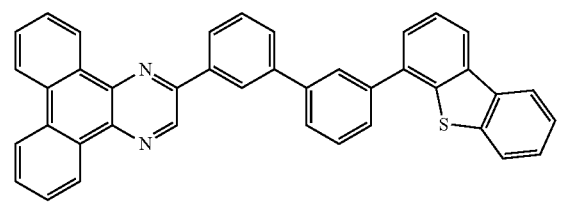
2mDBTBPDBq-II
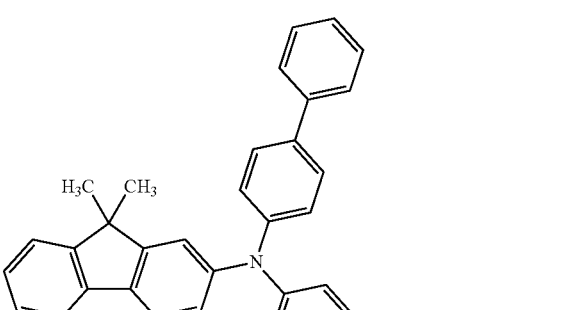
PCBBiF
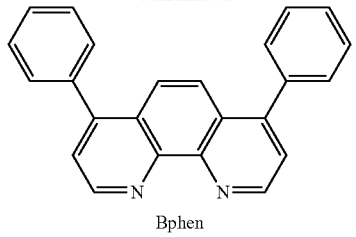
Bphen
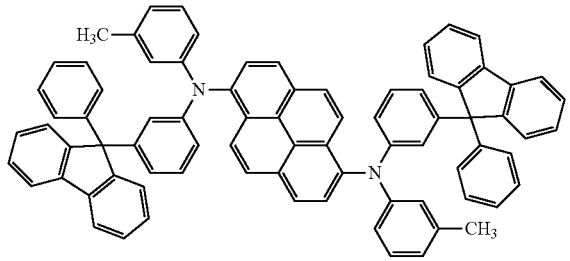
1,6mMemFLPAPrn
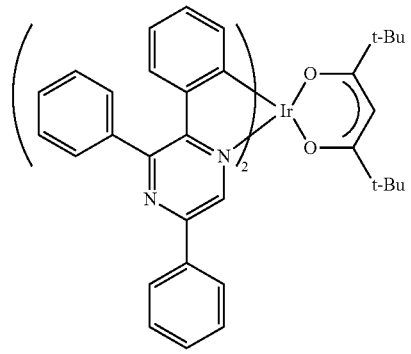
Ir(tppr)$_2$(dpm)
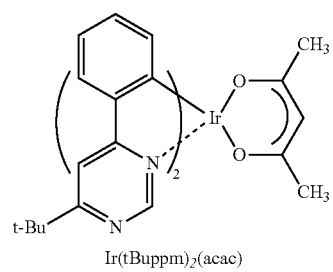
Ir(tBuppm)$_2$(acac)

TABLE 1

Structure of Light-emitting Element 1

| Layer | Reference numeral | Thickness (nm) | Material | Weight ratio |
|---|---|---|---|---|
| Second electrode | 102 | 200 | Al | — |
| Electron-injection layer | 130 | 1 | LiF | — |
| Electron-transport layer | 128(2) | 15 | Bphen | — |
|  | 128(1) | 10 | 2mDBTBPDBq-II | — |
| Second light-emitting layer | 122(2) | 20 | 2mDBTBPDBq-II:PCBBiF:Ir(tBuppm)$_2$(acac) | 0.7:0.3:0.05 |
|  | 122(1) | 10 | 2mDBTBPDBq-II:PCBBiF:Ir(tppr)$_2$(dpm) | 0.5:0.5:0.05 |
| First light-emitting layer | 120 | 20 | cgDBCzPA:PCzPA:1,6mMemFLPAPrn | 0.3:0.7:0.05 |
| Hole-transport layer | 126 | 20 | PCPPn | — |
| Hole-injection layer | 124 | 30 | DBT3P-II:MoO$_3$ | 2:1 |
| First electrode | 100 | 110 | ITSO | — |

1. Fabrication of Light-Emitting Element 1

Indium tin oxide containing silicon oxide (indium tin oxide doped with SiO$_2$: ITSO) which was formed over a glass substrate to have a thickness of 110 nm and an area of 4 mm$^2$ (2 mm×2 mm) was used as the first electrode 100. On the first electrode 100, 1,3,5-tri(dibenzothiophen-4-yl)benzene (DBT3P-II) and molybdenum oxide were deposited by co-evaporation in a weight ratio of DBT3P-II:MoO$_3$=2:1 to a thickness of 30 nm, so that the hole-injection layer 124 was formed.

On the hole-injection layer 124, 3-[4-(9-phenanthryl)-phenyl]-9-phenyl-9H-carbazole (PCPPn) was deposited by evaporation to a thickness of 20 nm, so that the hole-transport layer 126 was formed.

On the hole-transport layer 126, 7-[4-(10-phenyl-9-anthryl)phenyl]-7H-dibenzo[c,g]carbazole (cgDBCzPA), 9-phenyl-3-[4-(10-phenyl-9-anthryl)phenyl]-9H-carbazole (PCzPA), and N,N'-bis(3-methylphenyl)-N,N'-bis[3-(9-phenyl-9H-fluoren-9-yl)phenyl]pyrene-1,6-diamine (1,6mMemFLPAPrn) were deposited by co-evaporation in a weight ratio of cgDBCzPA:PCzPA:1,6mMemFLPAPrn=0.3:0.7:0.05 to a thickness of 20 nm, so that the first light-emitting layer 120 was formed.

On the first light-emitting layer 120, 2-[3'-(dibenzothiophen-4-yl)biphenyl-3-yl]dibenzo[f,h]quinoxaline (2mDBTBPDBq-II), N-(1,1'-biphenyl-4-yl)-9,9-dimethyl-N-[4-(9-phenyl-9H-carbazol-3-yl)phenyl]-9H-fluoren-2-amine (PCBBiF), and bis(2,3,5-triphenylpyrazinato)(dipivaloylmethanato)iridium(III) (Ir(tppr)$_2$(dpm)) were deposited by co-evaporation in a weight ratio of 2mDBTBPDBq-II:PCBBiF:Ir(tppr)$_2$(dpm)=0.5:0.5:0.05 to a thickness of 10 nm, so that a first layer 122(1) of the second light-emitting layer 122 was formed.

On the first layer 122(1), 2mDBTBPDBq-II, PCBBiF, and bis[2-(6-tert-butyl-4-pyrimidinyl-κN3)phenyl-KC](2,4-pentanedionato-κ$^2$O,O')iridium(III) (Ir(tBuppm)$_2$(acac)) were deposited by co-evaporation in a weight ratio of 2mDBTBPDBq-II:PCBBiF:Ir(tBuppm)$_2$(acac)=0.7:0.3:0.05 to a thickness of 20 nm, so that a second layer 122(2) of the second light-emitting layer 122 was formed.

On the second layer 122(2), 2mDBTBPDBq-II and bathophenanthroline (Bphen) were sequentially deposited by evaporation to a thickness of 10 nm and 15 nm, respectively, so that electron-transport layers 128(1) and 128(2) were formed. On the electron-transport layers 128(1) and 128(2), lithium fluoride (LT) was deposited by evaporation to a thickness of 1 nm to form the electron-injection layer 130. Furthermore, aluminum (Al) was deposited by evaporation to a thickness of 200 nm to form the second electrode 102. For sealing, a counter glass substrate was fixed to the glass substrate using a sealant in a nitrogen atmosphere. In this manner, the light-emitting element 1 was obtained.

2. Characteristics of Light-Emitting Element 1

Figure 10:
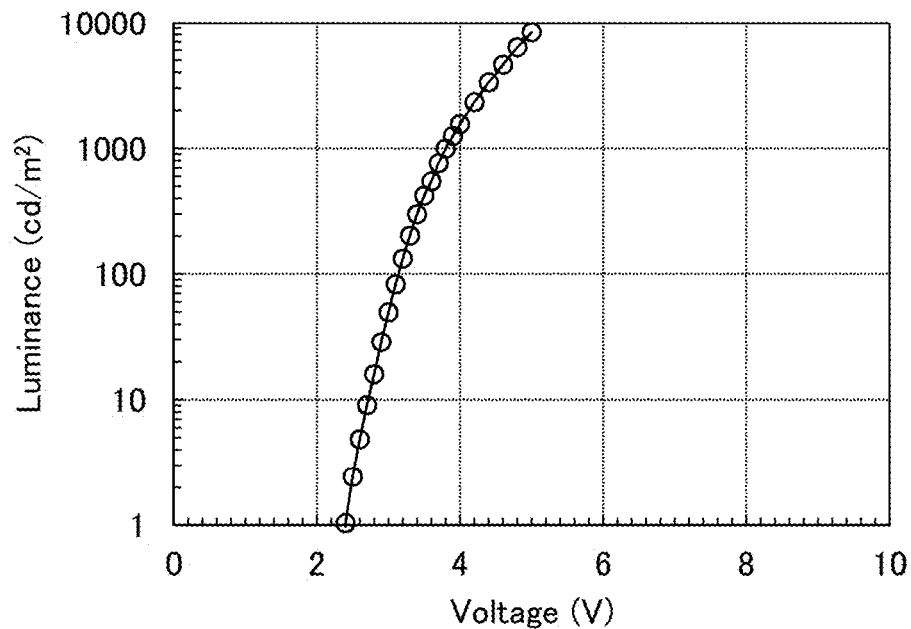
FIG. 10 shows a voltage-luminance curve of the light-emitting element 1 in Example 1.
Figure 11:
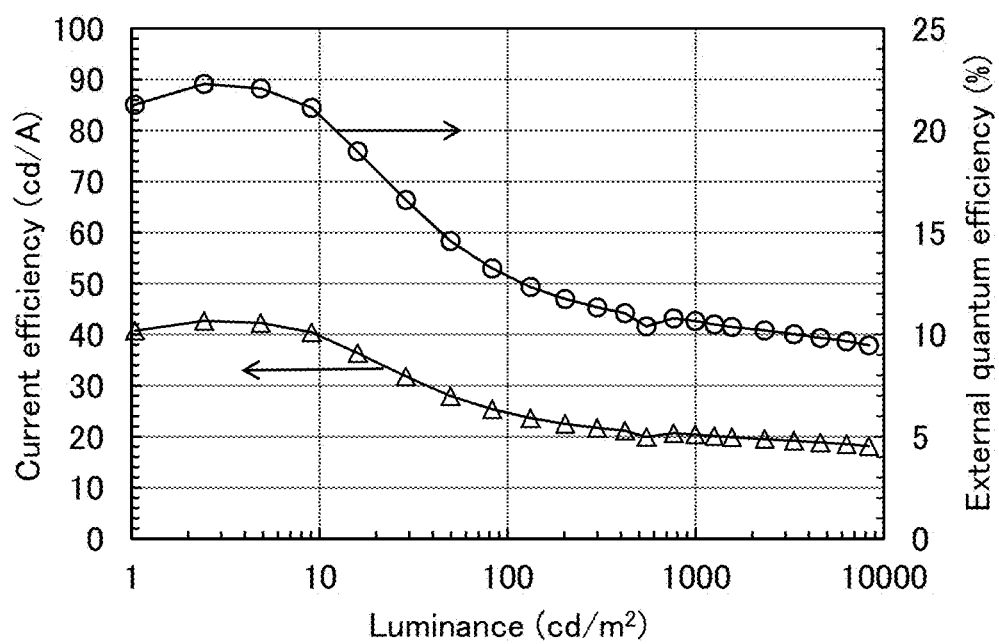
FIG. 11 shows a luminance-current efficiency curve and a luminance-external quantum efficiency curve of the light-emitting element 1 in Example 1.
Figure 12:
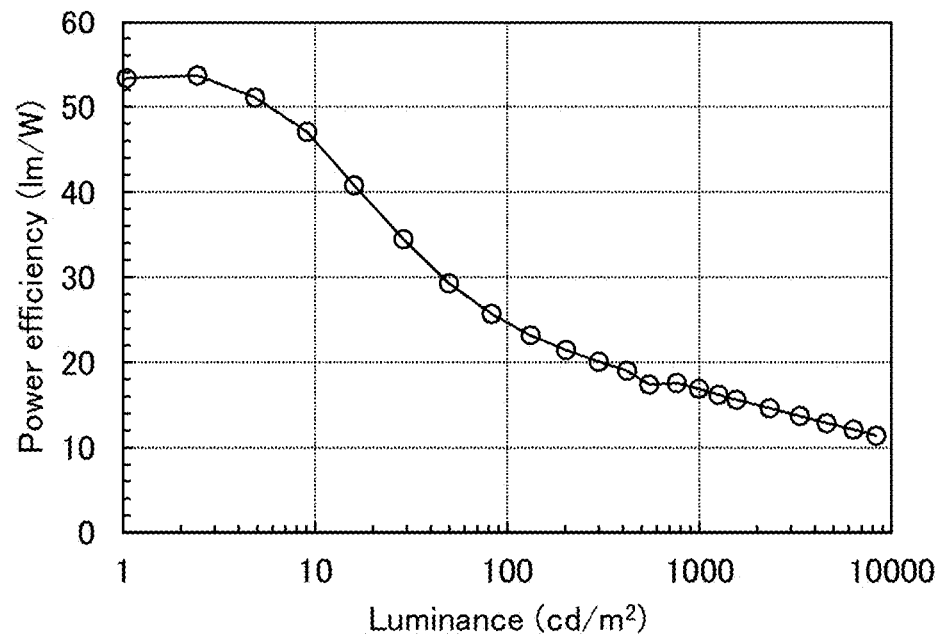
FIG. 12 shows a luminance-power efficiency curve of the light-emitting element 1 in Example 1.
Figure 13:
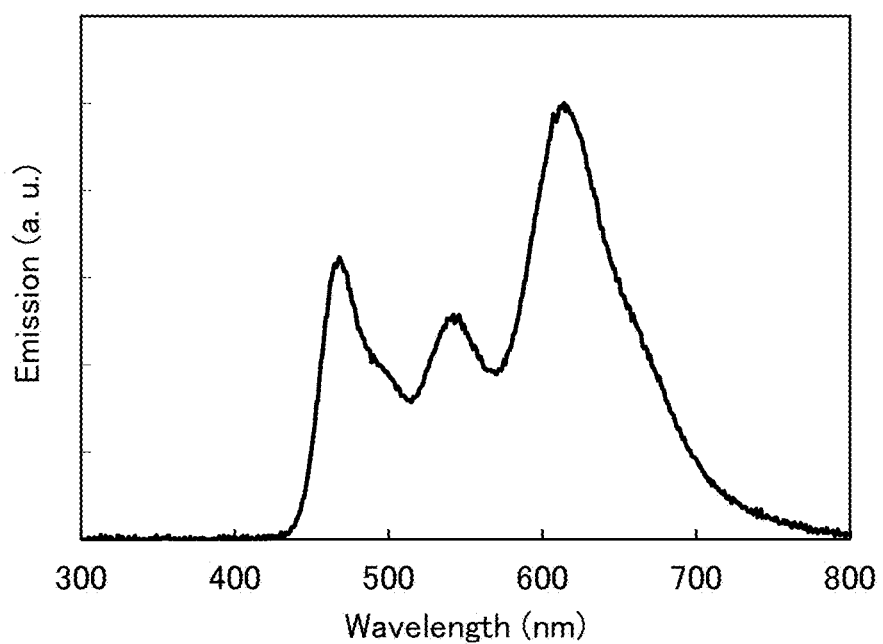
FIG. 13 shows an electroluminescence spectrum of the light-emitting element 1 in Example 1.

FIG. 10 to FIG. 13 show initial characteristics of the light-emitting element 1. As shown in FIG. 10, the light-emitting element 1 starts emitting light at around 2.4 V and its luminance exceeds 8000 cd/m$^2$ at a voltage of 5.0 V, which indicates that it can be driven at a low voltage. At 1000 cd/m$^2$, the current efficiency and the external quantum efficiency are 20.4 cd/A and 10.7%, respectively (see FIG. 11), and the power efficiency is 16.9 lm/W (see FIG. 12). These results reveal that the light-emitting element 1 has high efficiency. The light-emitting element 1 contains a blue-emitting fluorescent material (1,6mMemFLPAPrn) in the first light-emitting layer 120, a red-emitting phosphorescent material (Ir(tppr)$_2$(dpm)) in the first layer 122(1) of the second light-emitting layer 122, and a green-emitting phosphorescent material (Ir(tBuppm)$_2$(acac)) in the second layer 122(2) of the second light-emitting layer 122. FIG. 13 shows an electroluminescence spectrum of the light-emitting element at 500 cd/m$^2$. A peak is observed in each of the red, blue, and green wavelength regions, which indicates that light is concurrently emitted from these three light-emitting materials. The chromaticity of the light emission at 1000 cd/m$^2$ was (x, y)=(0.38, 0.36), which suggests white light emission.

Example 2

Figure 9B:
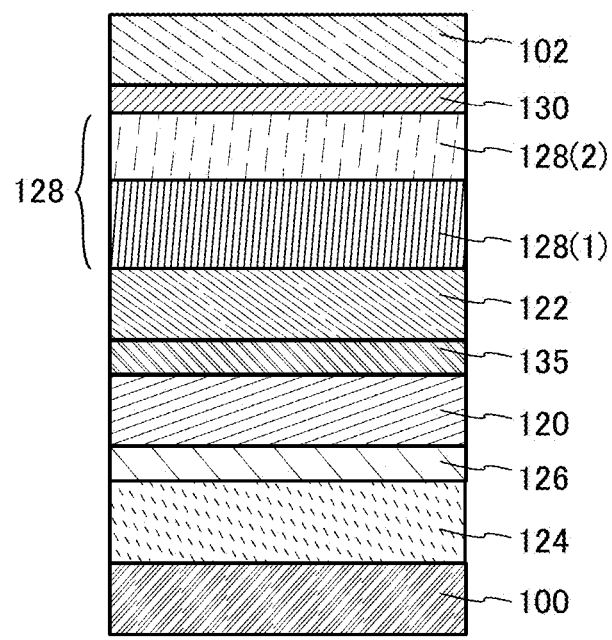

In this example, an example of fabricating a light-emitting element of one embodiment of the present invention will be described. FIG. 9B is a schematic view of a light-emitting element (light-emitting element 2) fabricated in this example, Table 2 shows the detailed structure of the element, and structures and abbreviations of compounds used here are given below. Note that the structures and abbreviations of the compounds used for the light-emitting element 1 described in Example 1 are omitted.

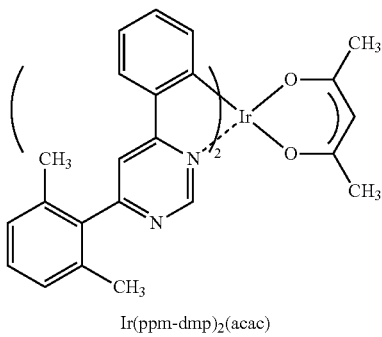

Ir(ppm-dmp)₂(acac)

formed. Lastly, sealing was performed in a manner similar to that of the light-emitting element 1. In this manner, the light-emitting element 2 was obtained.

2. Characteristics of Light-Emitting Element 2

Figure 14:
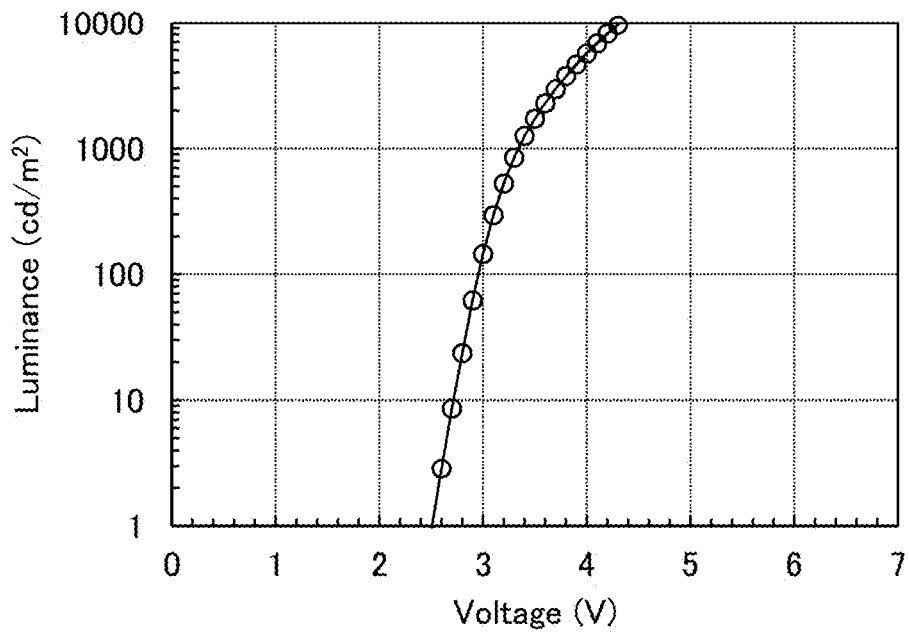
FIG. 14 shows a voltage-luminance curve of the light-emitting element 2 in Example 2.
Figure 15:
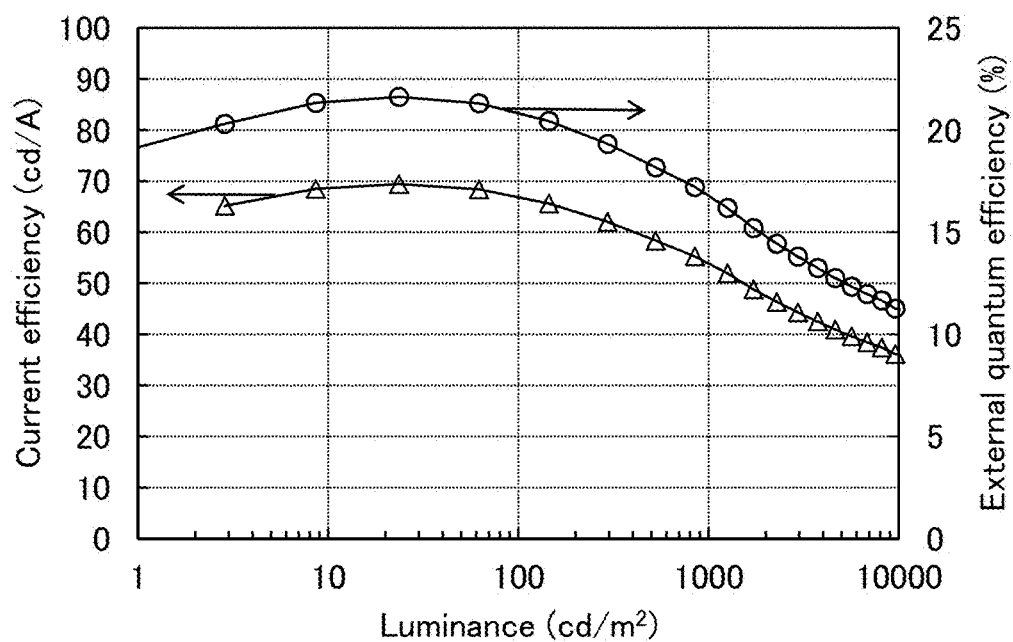
FIG. 15 shows a luminance-current efficiency curve and a luminance-external quantum efficiency curve of the light-emitting element 2 in Example 2.
Figure 16:
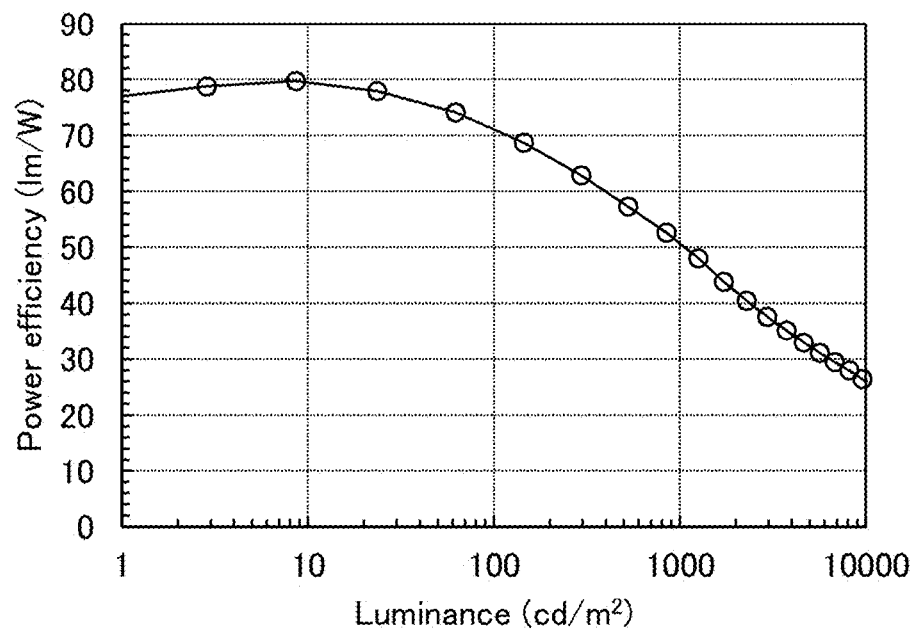
FIG. 16 shows a luminance-power efficiency curve of the light-emitting element 2 in Example 2.

FIG. 14 to FIG. 17 show initial characteristics of the light-emitting element 2. As shown in FIG. 14, the light-emitting element 2 starts to emit light at around 2.6 V and its luminance exceeds 10000 cd/m$^2$ at a voltage of 4.3 V, which indicates that it can be driven at a low voltage. At 1000 cd/m$^2$, the current efficiency and the external quantum efficiency are 55.3 cd/A and 17.2%, respectively (see FIG. 15), and the power efficiency is 52.6 lm/W (see FIG. 16). These results reveal that the light-emitting element 2 has high efficiency. The light-emitting element 2 contains a

TABLE 2

Structure of Light-emitting Element 2

| Layer | Reference numeral | Thickness (nm) | Material | Weight ratio |
|---|---|---|---|---|
| Second electrode | 102 | 200 | Ag | — |
|  | 1 |  | Ag:Mg | 0.6:0.2 $^a$ |
| Electron-injection layer | 130 | 1 | LiF | — |
| Electron-transport layer | 128(2) | 15 | Bphen | — |
|  | 128(1) | 10 | 2mDBTBPDBq-II | — |
| Second light-emitting layer | 122 | 20 | 2mDBTBPDBq-II:PCBBiF:Ir(ppm-dmp)₂(acac) | 0.8:0.2:0.05 |
| Separation layer | 135 | 2 | 2mDBTBPDBq-II:PCBBiF | 0.6:0.4 |
| First light-emitting layer | 120 | 10 | PCzPA:1,6mMemFLPAPrn | 1:0.05 |
| Hole-transport layer | 126 | 20 | PCPPn | — |
| Hole-injection layer | 124 | 30 | DBT3P-II:MoO₃ | 2:1 |
| First electrode | 100 | 110 | ITSO | — |

$^a$ Volume ratio.

1. Fabrication of Light-Emitting Element 2

In a manner similar to that of the light-emitting element 1, the hole-injection layer 124 and the hole-transport layer 126 were formed over the first electrode 100, and then, PCzPA and 1,6mMemFLPAPm were deposited by co-evaporation in a weight ratio of PCzPA:1,6mMetnFL-PAPm=1:0.05 to a thickness of 10 nm, so that the first light-emitting layer 120 was formed.

On the first light-emitting layer 120, 2mDBTBPDBq-II and PCBBiF were deposited by co-evaporation in a weight ratio of 2mDBTBPDBq-II:PCBBiF=0.6:0.4 to a thickness of 2 nm, so that the separation layer 135 was formed.

On the separation layer 135, 2mDBTBPDBq-II, PCBBiF, and bis{2-[6-(2,6-dimethylphenyl)-4-pyrimidinyl-κN3]phenyl-κC}(2,4-pentanedionato-κO,O')iridium(III) (Ir(ppm-dmp)₂(acac)) were deposited by co-evaporation in a weight ratio of 2mDBTBPDBq-II:PCBBiF: Ir(ppm-dmp)₂(acac)=0.8:0.2:0.05 to a thickness of 20 nm, so that the second light-emitting layer 122 was formed.

Figure 17:
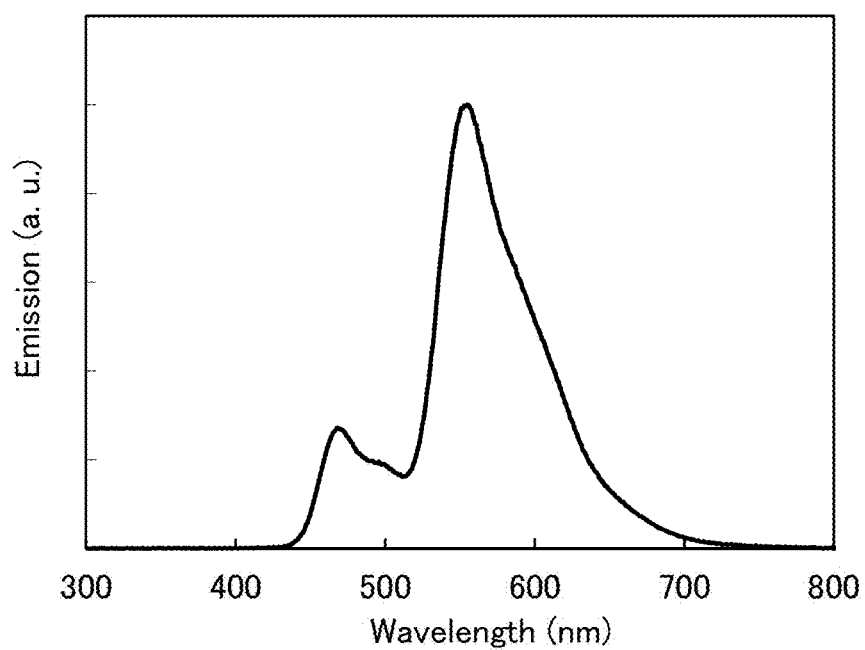
FIG. 17 shows an electroluminescence spectrum of the light-emitting element 2 in Example 2.

On the second light-emitting layer 122, 2mDBTBPDBq-II and Bphen were sequentially deposited by evaporation to a thickness of 10 nm and 15 nm, respectively, so that the electron-transport layers 128(1) and 128(2) were formed. On the electron-transport layers 128(1) and 128(2), lithium fluoride was deposited by evaporation to a thickness of 1 nm to form the electron-injection layer 130. Furthermore, an alloy of silver and magnesium was deposited by co-evaporation in a volume ratio of Ag:Mg=0.6:0.2 to a thickness of 1 nm, and silver was deposited thereon by evaporation to a thickness of 200 nm; thus, the second electrode 102 was blue-emitting fluorescent material (1,6mMemFLPAPrn) in the first light-emitting layer 120 and a yellow-emitting phosphorescent material (Ir(ppm-dmp)₂(acac)) in the second light-emitting layer 122. FIG. 17 shows an electroluminescence spectrum of the light-emitting element 2 at 1000 cd/m$^2$. A peak is observed in each of the blue and yellow wavelength regions, which indicates that light is concurrently emitted from these two light-emitting materials. The chromaticity of the light emission at 1000 cd/m$^2$ was (x, y)=(0.41, 0.49).

As demonstrated above, the light-emitting elements of this example show a high current efficiency and can be operated at a low drive voltage. The structures described in this example can be used in appropriate combination with any of the embodiments and the other example.

Reference Example 1

Figure 18A:
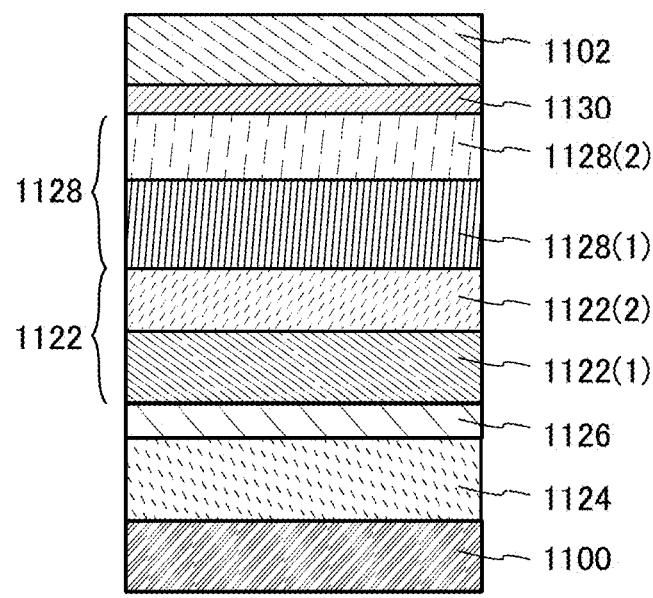
FIGS. 18A and 18B are schematic views of light-emitting elements 3 to 6 (LEEs 3 to 6) in Reference Example 1.
Figure 18B:
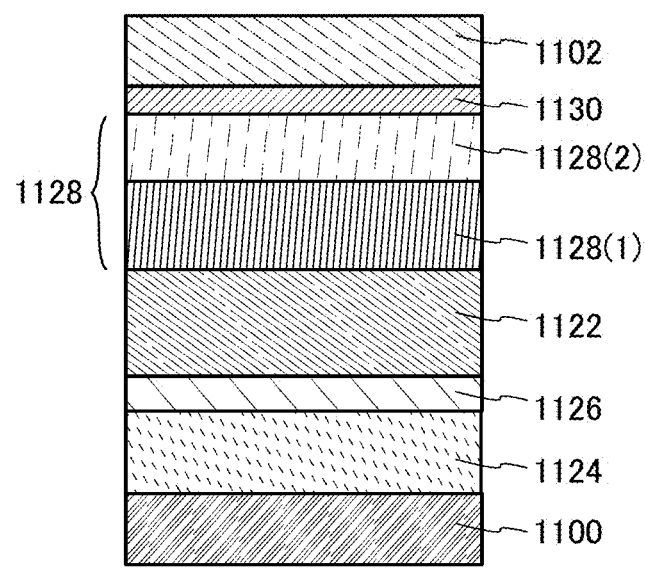

As described in Embodiment 1, the addition of the additive to the second light-emitting layer 122 to form an exciplex allows a drastic increase in the emission efficiency. Examples are shown by using the following light-emitting elements (light-emitting elements 3 to 6 (LEEs 3 to 6)). Table 3 shows the detailed structures of the elements. Structures and abbreviations of compounds used here are given below. FIG. 18A is a schematic cross-sectional view of the light-emitting elements 3 and 5 and FIG. 18B is a schematic cross-sectional view of the light-emitting elements 4 and 6.

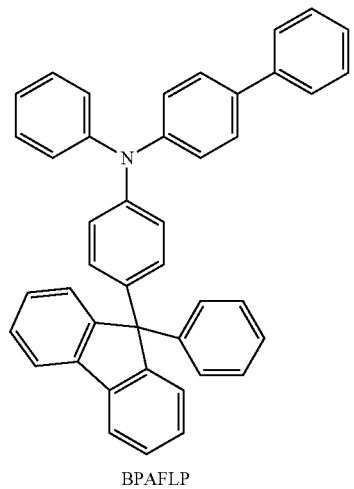

BPAFLP

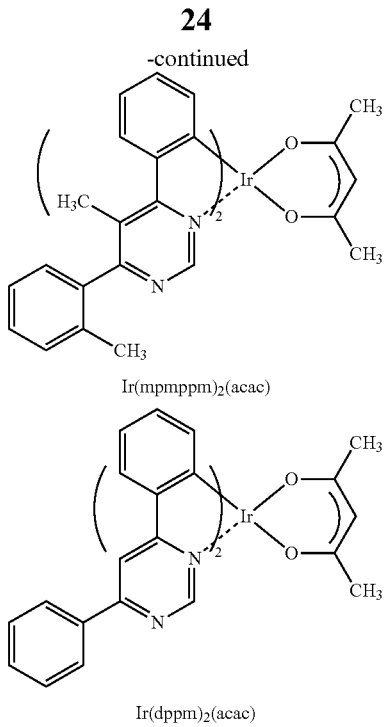

Ir(mpmppm)$_2$(acac)

Ir(dppm)$_2$(acac)

TABLE 3

Structures of LEEs 3 to 6.

| LEE | Layer | Reference numeral | Thickness (nm) | Material | Weight ratio |
|---|---|---|---|---|---|
| 3 | Second electrode | 1102 | 200 | Al | — |
|   | Electron-injection layer | 1130 | 1 | LiF | — |
|   | Electron-transport layer | 1128(2) | 10 | Bphen | — |
|   |  | 1128(1) | 20 | 2mDBTBPDBq-II | — |
|   | Light-emitting layer | 1122(2) | 20 | 2mDBTBPDBq-II:PCBBiF:Ir(tBuppm)$_2$(acac) | 0.8:0.2:0.05 |
|   |  | 1122(1) | 20 | 2mDBTBPDBq-II:PCBBiF:Ir(tBuppm)$_2$(acac) | 0.7:0.3:0.05 |
|   | Hole-transport layer | 1126 | 20 | BPAFLP | — |
|   | Hole-injection layer | 1124 | 50 | DBT3P-II:MoO$_3$ | 1:0.5 |
|   | First electrode | 1100 | 110 | ITSO | — |
| 4 | Second electrode | 1102 | 130 | Al | — |
|   | Electron-injection layer | 1130 | 1 | LiF | — |
|   | Electron-transport layer | 1128(2) | 20 | Bphen | — |
|   |  | 1128(1) | 15 | 2mDBTBPDBq-II | — |
|   | Light-emitting layer | 1122 | 40 | 2mDBTBPDBq-II:PCBBiF:Ir(mpmppm)$_2$(acac) | 0.8:0.2:0.06 |
|   | Hole-transport layer | 1126 | 20 | BPAFLP | — |
|   | Hole-injection layer | 1124 | 10 | DBT3P-II:MoO$_3$ | 1:0.5 |
|   | First electrode | 1100 | 110 | ITSO | — |
| 5 | Second electrode | 1102 | 200 | Al | — |
|   | Electron-injection layer | 1130 | 1 | LiF | — |
|   | Electron-transport layer | 1128(2) | 20 | Bphen | — |
|   |  | 1128(1) | 20 | 2mDBTBPDBq-II | — |
|   | Light-emitting layer | 1122(2) | 20 | 2mDBTBPDBq-II:PCBBiF:Ir(dppm)$_2$(acac) | 0.8:0.2:0.05 |
|   |  | 1122(1) | 20 | 2mDBTBPDBq-II:PCBBiF:Ir(dppm)$_2$(acac) | 0.7:0.3:0.05 |
|   | Hole-transport layer | 1126 | 20 | BPAFLP | — |
|   | Hole-injection layer | 1124 | 20 | DBT3P-II:MoO$_3$ | 1:0.5 |
|   | First electrode | 1100 | 110 | ITSO | — |
| 6 | Second electrode | 1102 | 200 | Al | — |
|   | Electron-injection layer | 1130 | 1 | LiF | — |
|   | Electron-transport layer | 1128(2) | 15 | Bphen | — |
|   |  | 1128(1) | 20 | 2mDBTBPDBq-II | — |
|   | Light-emitting layer | 1122 | 40 | 2mDBTBPDBq-II:PCBBiF:Ir(tppr)$_2$(dpm) | 0.8:0.2:0.05 |
|   | Hole-transport layer | 1126 | 20 | BPAFLP | — |
|   | Hole-injection layer | 1124 | 60 | BPAFLP:MoO$_3$ | 1:0.5 |
|   | First electrode | 1100 | 70 | ITSO | — |

1. Fabrication of Light-Emitting Element 3

As a first electrode 1100, an ITSO film was formed over a glass substrate to a thickness of 110 nm. The electrode area of the first electrode 1100 was 4 mm$^2$ (2 mm×2 mm).

Next, as a hole-injection layer 1124, DBT3P-II and MoO$_3$ were deposited on the first electrode 1100 by co-evaporation in a weight ratio of DBT3P-II:MoO$_3$=1:0.5 to a thickness of 50 nm.

Then, as a hole-transport layer 1126, 4-phenyl-4'-(9-phenylfluoren-9-yl)triphenylamine (abbreviation: BPAFLP) was deposited on the hole-injection layer 1124 by evaporation to a thickness of 20 nm.

Subsequently, as light-emitting layers 1122(1) and 1122(2), 2mDBTBPDBq-II, PCBBiF, and Ir(tBuppm)$_2$(acac) were deposited on the hole-transport layer 1126 by co-evaporation in a weight ratio of 2mDBTBPDBq-II:PCBBiF:Ir(tBuppm)$_2$(acac)=0.7:0.3:0.05 to a thickness of 20 nm, and further deposited by co-evaporation in a weight ratio of 2mDBTBPDBq-II:PCBBiF:Ir(tBuppm)$_2$(acac)=0.8:0.2:0.05 to a thickness of 20 nm. In a light-emitting layer 1122, 2mDBTBPDBq-II is a host material, PCBBiF is an additive which can form an exciplex together with the host material, and Ir(tBuppm)$_2$(acac) is a light-emitting material.

Next, as an electron-transport layer 1128(1), an electron-transport layer 1128(2), and an electron-injection layer 1130, 2mDBTBPDBq-II, Bphen, and LiF were sequentially deposited on the light-emitting layer 1122(2) by evaporation to a thickness of 20 nm, 10 nm, and 1 nm, respectively.

Subsequently, as a second electrode 1102, aluminum (Al) was formed on the electron-injection layer 1130 to a thickness of 200 nm.

Through the above steps, the light-emitting element 3 was fabricated over the glass substrate. Note that in the above deposition process, evaporation was all performed by a resistance heating method.

Next, the light-emitting element 3 was sealed by fixing a sealing substrate to the glass substrate using a sealant for an organic EL device in a glove box containing a nitrogen atmosphere. Specifically, the sealant was applied to surround the light-emitting element, the glass substrate and the sealing substrate were bonded to each other, irradiation with 365-nm ultraviolet light at 6 J/cm$^2$ was performed, and heat treatment was performed at 80° C. for 1 hour. Through the above steps, the light-emitting element 3 was obtained.

2. Fabrication of Light-Emitting Element 4

The light-emitting element 4 was fabricated by the same method as the light-emitting element 3, except for the following steps.

As the hole-injection layer 1124 on the first electrode 1100, DBT3P-II and MoO$_3$ were deposited by co-evaporation in a weight ratio of DBT3P-II:MoO$_3$=1:0.5 to a thickness of 10 nm.

As the light-emitting layer 1122, 2mDBTBPDBq-II, PCBBiF, and bis{2-[5-methyl-6-(2-methylphenyl)-4-pyrimidinyl-κN3]phenyl-κC}(2,4-pentanedionato-κ$^2$O,O')iridium(III)) (Ir(mpmppm)$_2$(acac)) were deposited on the hole-transport layer 1126 by co-evaporation in a weight ratio of 2mDBTBPDBq-II:PCBBiF:Ir(mpmppm)$_2$(acac)=0.8:0.2:0.06 to a thickness of 40 nm. In the light-emitting layer 1122, 2mDBTBPDBq-II is a host material, PCBBiF is an additive which can form an exciplex together with the host material, and Ir(mpmppm)$_2$(acac) is a light-emitting material.

Next, as the electron-transport layers 1128(1) and 1128(2), 2mDBTBPDBq-II and Bphen were sequentially deposited on the light-emitting layer 1122 by evaporation to a thickness of 15 nm and 20 nm, respectively.

3. Fabrication of Light-Emitting Element 5

The light-emitting element 5 was fabricated by the same method as the light-emitting element 3, except for the following steps.

As the hole-injection layer 1124 on the first electrode 1100, DBT3P-II and MoO$_3$ were deposited by co-evaporation in a weight ratio of DBT3P-II:MoO$_3$=1:0.5 to a thickness of 20 nm.

As the light-emitting layers 1122(1) and 1122(2), 2mDBTBPDBq-II, PCBBiF, and (acetylacetonato)bis(4,6-diphenylpyrimidinato)iridium(III) (abbreviation: Ir(dppm)$_2$(acac)) were deposited on the hole-transport layer 1126 by co-evaporation in a weight ratio of 2mDBTBPDBq-II:PCBBiF:Ir(dppm)$_2$(acac)=0.7:0.3:0.05 to a thickness of 20 nm, and further deposited by co-evaporation in a weight ratio of 2mDBTBPDBq-II:PCBBiF:Ir(dppm)$_2$(acac)=0.8:0.2:0.05 to a thickness of 20 MIL In the light-emitting layer 1122, 2mDBTBPDBq-II is a host material, PCBBiF is an additive which can form an exciplex together with the host material, and Ir(dppm)$_2$(acac) is a light-emitting material.

Next, as the electron-transport layers 1128(1) and 1128(2), 2mDBTBPDBq-II and Bphen were sequentially deposited on the light-emitting layer 1122(2) by evaporation each to a thickness of 20 nm.

4. Fabrication of Light-Emitting Element 6

The light-emitting element 6 was fabricated by the same method as the light-emitting element 3, except for the following steps.

As the first electrode 1100, an ITSO film was formed over a glass substrate to a thickness of 70 nm.

Next, as the hole-injection layer 1124 on the first electrode 1100, BPAFLP and MoO$_3$ were deposited by co-evaporation in a weight ratio of BPAFLP:MoO$_3$=1:0.5 to a thickness of 60 nm.

As the light-emitting layer 1122, 2mDBTBPDBq-II, PCBBiF, and Ir(tppr)$_2$(dpm) were deposited on the hole-transport layer 1126 by co-evaporation in a weight ratio of 2mDBTBPDBq-II:PCBBiF:Ir(tppr)$_2$(dpm)=0.8:0.2:0.05 to a thickness of 40 nm. In the light-emitting layer 1122, 2mDBTBPDBq-II is a host material, PCBBiF is an additive which can form an exciplex together with the host material, and Ir(tppr)$_2$(dpm) is a light-emitting material.

Next, as the electron-transport layers 1128(1) and 1128(2), 2mDBTBPDBq-II and Bphen were sequentially deposited on the light-emitting layer 1122 by evaporation to a thickness of 20 nm and 15 nm, respectively.

5. Characteristics of Light-Emitting Elements 3 to 6

Figure 19:
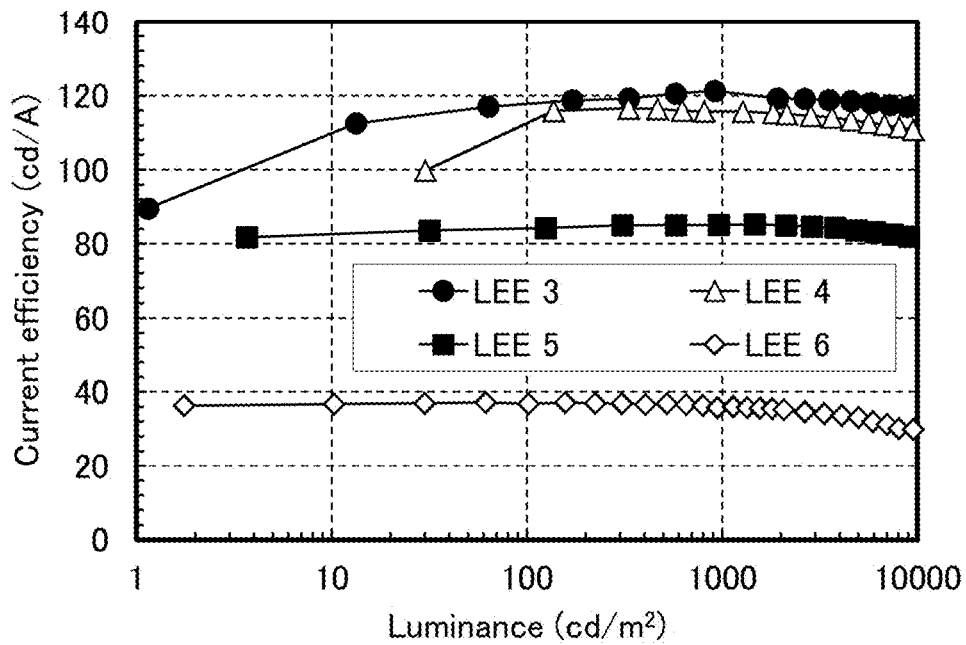
FIG. 19 shows luminance-current efficiency curves of the light-emitting elements 3 to 6 in Reference Example 1.
Figure 20:
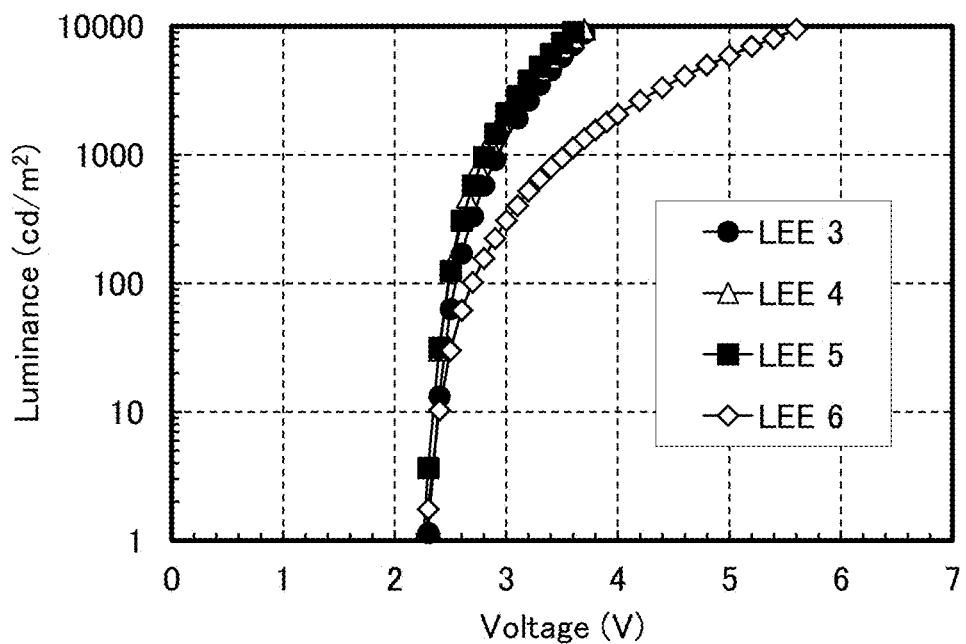
FIG. 20 shows voltage-luminance curves of the light-emitting elements 3 to 6 in Reference Example 1.
Figure 21:
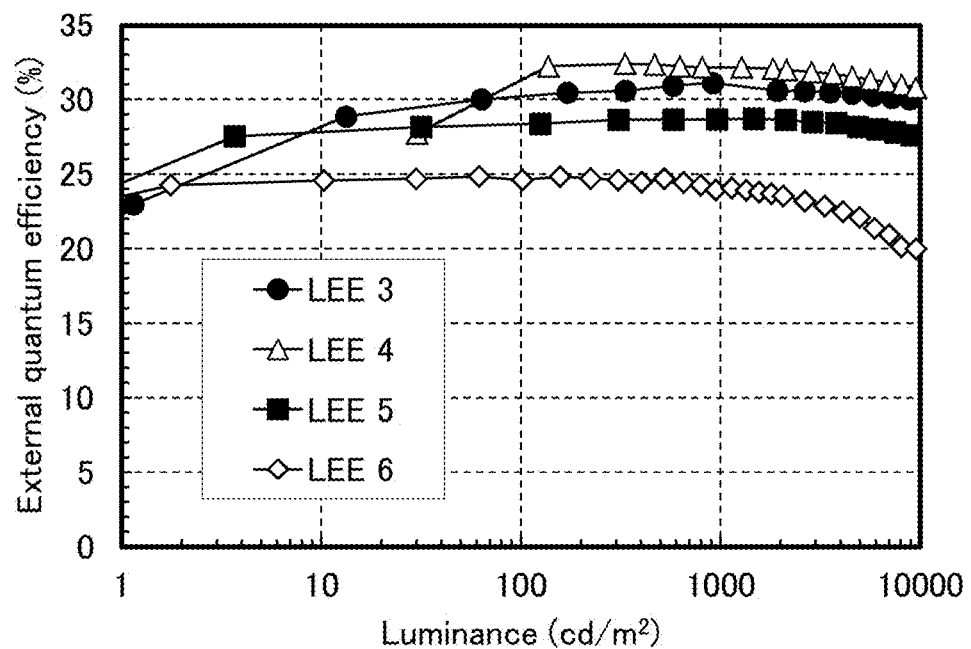
FIG. 21 shows luminance-external quantum efficiency curves of the light-emitting elements 3 to 6 in Reference Example 1.

FIG. 19 shows luminance-current efficiency curves of the fabricated light-emitting elements 3 to 6. FIG. 20 shows their voltage-luminance curves. FIG. 21 shows their luminance-external quantum efficiency curves. The measurements of the light-emitting elements were performed at room temperature (in an atmosphere kept at 23° C.).

Table 4 shows the device characteristics of the light-emitting elements 3 to 6 at around 1000 cd/m$^2$. Note that the external quantum efficiency in FIG. 21 and Table 4 was calculated in consideration of light distribution characteristics.

TABLE 4

| | | Device characteristics of the LEEs 3 to 6. | | | | |
|---|---|---|---|---|---|---|
| LEE | Voltage (V) | Current density (mA/cm$^2$) | CIE chromaticity (x, y) | Luminance (cd/m$^2$) | Current efficiency (cd/A) | External quantum efficiency (%) |
| 3 | 2.9 | 0.76 | (0.41, 0.58) | 920 | 120 | 31 |
| 4 | 2.8 | 0.88 | (0.49, 0.50) | 1000 | 120 | 32 |
| 5 | 2.8 | 1.1 | (0.56, 0.44) | 960 | 85 | 29 |
| 6 | 3.4 | 2.2 | (0.66, 0.34) | 800 | 36 | 24 |

Figure 22:
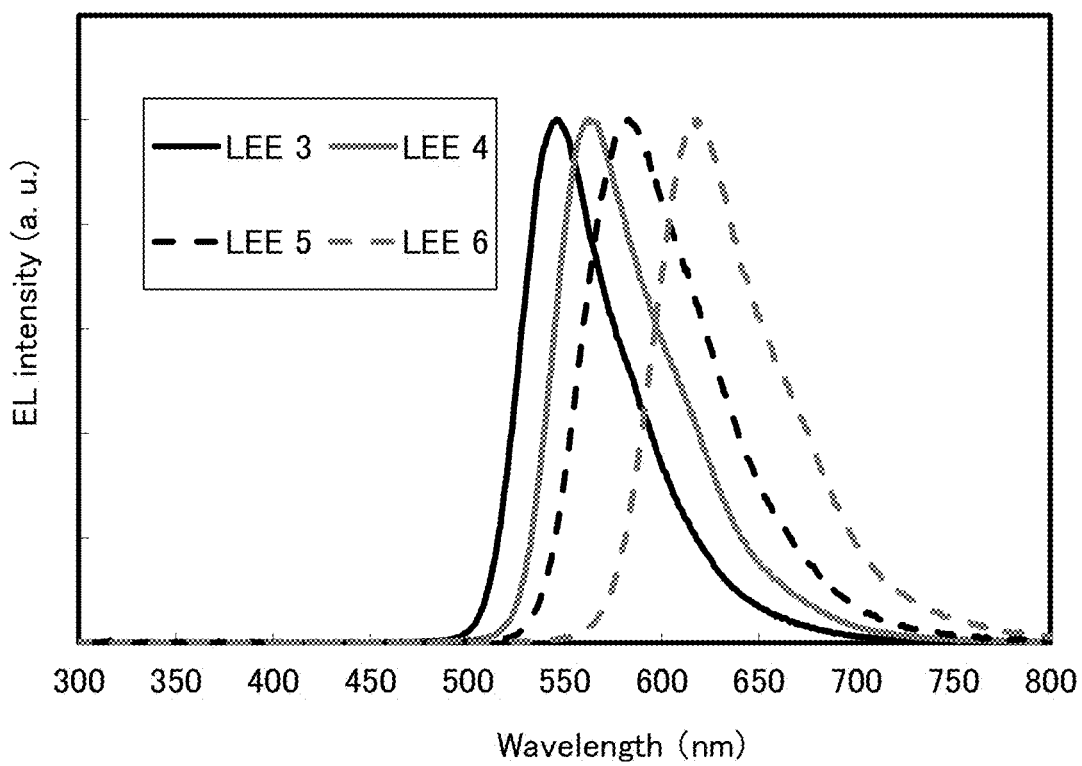
FIG. 22 shows electroluminescence spectra of the light-emitting elements 3 to 6 in Reference Example 1.

FIG. 22 shows electroluminescence spectra obtained by supplying the light-emitting elements 3 to 6 with a current at a current density of 2.5 mA/cm$^2$. The light-emitting element 3 emits green light, the light-emitting element 4 emits yellow light, the light-emitting element 5 emits orange light, and the light-emitting element 6 emits red light.

As shown in FIG. 19 to FIG. 22 and Table 4, the light-emitting elements 3 to 6 emit light with high current efficiency and high external quantum efficiency at a low drive voltage. Furthermore, the efficiency of the light-emitting elements 3 to 6 decreases only slightly even in a high luminance region, and the high emission efficiency is maintained.

Figure 23:
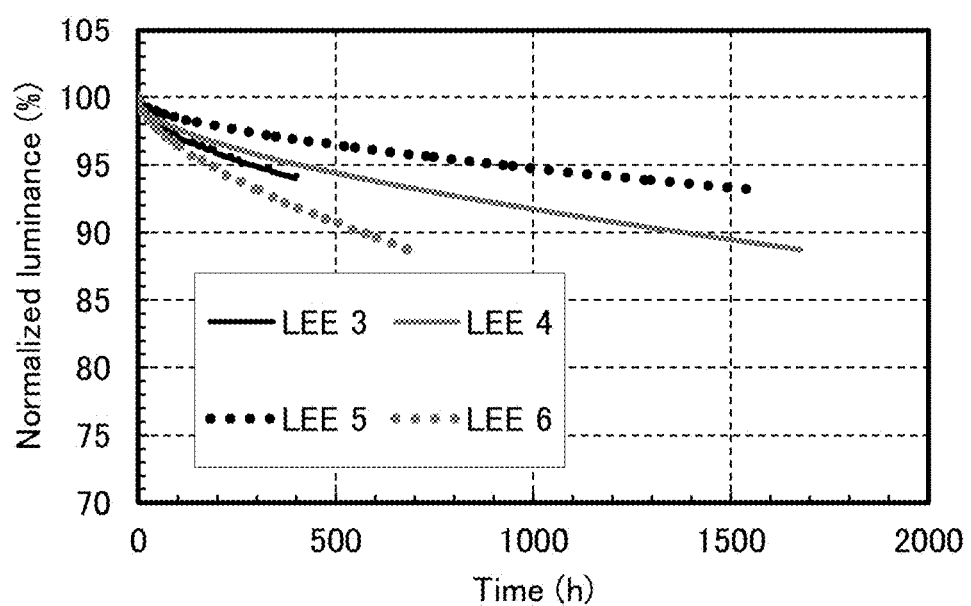
FIG. 23 shows results of reliability tests of the light-emitting elements 3 to 6 in Reference Example 1.

Results of reliability tests of the light-emitting elements 3 to 6 are shown in FIG. 23. In the reliability tests, the light-emitting elements 3 to 6 were driven under the conditions where the initial luminance of the light-emitting elements was set to 5000 cd/m$^2$ and the current density was constant.

From the results, the time (LT90) taken for the luminance of the light-emitting elements 3 to 6 to decrease to 90% of the initial luminance was estimated: the light-emitting element 3, 1000 hours; the light-emitting element 4, 1300 hours; the emitting element 5, 2800 hours; and the light-emitting element 6, 560 hours. The above results prove the high reliability of the elements.

As described above, when the light-emitting layer 1122 contains an additive capable of forming an exciplex together with a host material and the exciplex is utilized as an energy transfer medium, regardless of emission color, green- to red-emissive light-emitting elements with high current efficiency, high external quantum efficiency, and a low drive voltage are obtained. Moreover, highly reliable light-emitting elements are obtained.

Reference Example 2

A synthesis method of Ir(ppm-dmp)$_2$(acac) used in Example 2 will be described. The synthesis scheme is as follows.

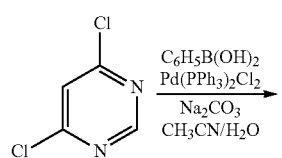

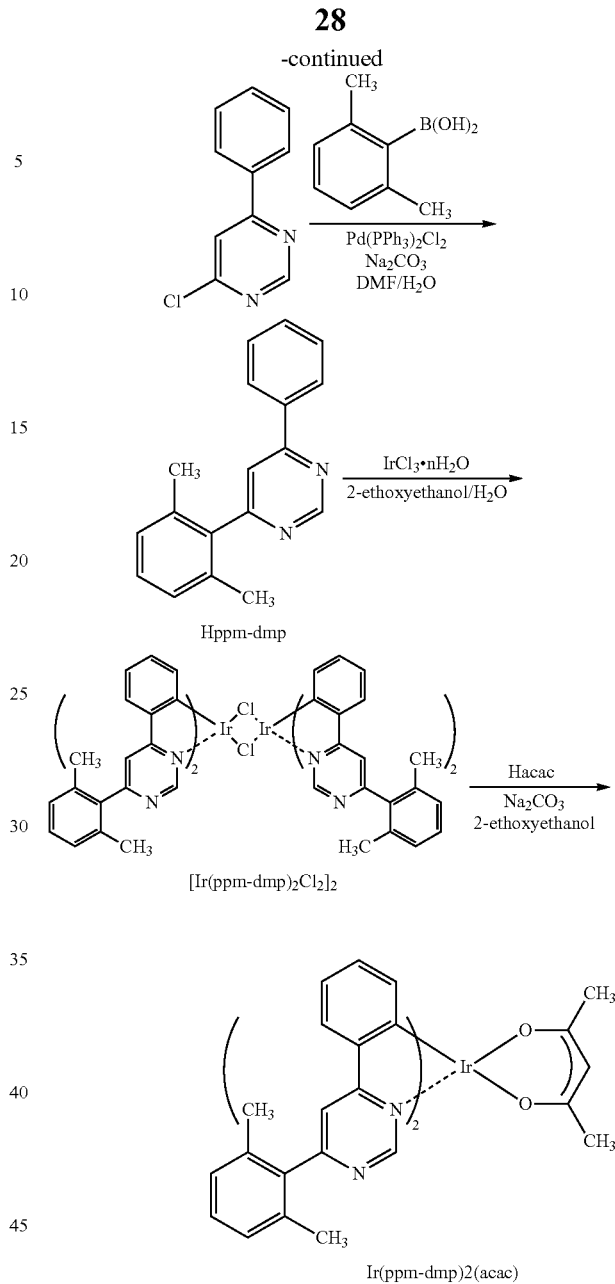

1. Synthesis of 4-Chloro-6-phenylpyrimidine

A mixture of 5.0 g of 4,6-dichloropyrimidine, 4.9 g of phenylboronic acid, 7.1 g of sodium carbonate, 0.34 g of bis(triphenylphosphine)palladium(II)dichloride (PdCl$_2$(PPh$_3$)$_2$), 20 mL of acetonitrile, and 20 mL of water was heated to reflux by irradiation with microwaves (2.45 GHz, 100 W) under an argon stream for 1 hour. The obtained mixture was subjected to extraction with dichloromethane and purified by silica gel column chromatography (developing solvent: dichloromethane), whereby 1.6 g of 4-chloro-6-phenylpyrimidine were obtained (yield: 23%, a pale yellow solid). Note that the microwave irradiation in this reference example was performed using a microwave synthesis system (Discover, manufactured by CEM Corporation).

2. Synthesis of 4-Phenyl-6-(2,6-dimethylphenyl)pyrimidine (Hppm-dmp)

A mixture of 1.6 g of 4-chloro-6-phenylpyrimidine, 1.5 g of 2,6-dimethylphenylboronic acid, 1.8 g of sodium carbonate, 59 mg of $PdCl_2(PPh_3)_2$, 20 mL of N,N-dimethylformamide, and 20 mL of water was heated to reflux by irradiation with microwaves (2.45 GHz, 100 W) under an argon stream for 2 hours. The obtained mixture was subjected to extraction with dichloromethane and purified by silica gel column chromatography (developing solvent: ethyl acetate and hexane in a ratio of 1:5), whereby 0.50 g of Hppm-dmp were obtained (yield: 23%, a pale yellow oily substance).

3. Synthesis of Di-µ-chloro-tetrakis{2-[6-(2,6-dimethylphenyl)-4-pyrimidinyl-κN3]phenyl-κC}diiridium(III) ($[Ir(ppm-dmp)_2Cl]_2$)

A mixture of 1.0 g of Hppm-dmp, 0.57 g of iridium(III) chloride hydrate, 20 mL of 2-ethoxyethanol, and 20 mL of water was heated to reflux by irradiation with microwaves (2.45 GHz, 100 W) under an argon stream for 3 hours. The obtained mixture was filtrated and the resulting solid was washed with methanol, whereby 1.1 g of $[Ir(ppm-dmp)_2Cl]_2$ were obtained (yield: 74%, an orange solid).

4. Synthesis of $Ir(ppm-dmp)_2(acac)$

A mixture of 1.1 g of $[Ir(ppm-dmp)_2Cl]_2$, 0.77 g of sodium carbonate, 0.23 g of acetylacetone (Hacac), and 30 mL of 2-ethoxyethanol was heated to reflux by irradiation with microwaves (2.45 GHz, 120 W) under an argon stream for 2 hours. The obtained mixture was filtrated, and an insoluble part was washed with methanol. The obtained filtrate was condensed, a residue was purified by silica gel column chromatography (developing solvent: ethyl acetate and hexane in a ratio of 1:5), and the obtained solid was recrystallized from hexane, whereby $Ir(ppm-dmp)_2(acac)$ was obtained (yield: 59%, an orange powdered solid). By a train sublimation method, 0.21 g of the obtained orange powdered solid were purified, whereby the objective orange solid was collected in a yield of 48%. The conditions of the purification by sublimation were as follows: the pressure was 2.7 Pa; the flow rate of an argon gas was 5.0 mL/min; and the temperature was 240° C. $^1$H-NMR (nuclear magnetic resonance) spectrum data of the obtained $Ir(ppm-dmp)_2(acac)$ are shown below.

$^1$H-NMR, δ ($CDCl_3$): 1.85 (s, 6H), 2.26 (s, 12H), 5.35 (s, 1H), 6.46-6.48 (dd, 2H), 6.83-6.90 (dm, 4H), 7.20-7.22 (d, 4H), 7.29-7.32 (t, 2H), 7.63-7.65 (dd, 2H), 7.72 (ds, 2H), 9.24 (ds, 2H).

This application is based on Japanese Patent Application serial no. 2014-099560 filed with Japan Patent Office on May 13, 2014 and Japanese Patent Application serial no. 2014-241575 filed with Japan Patent Office on Nov. 28, 2014, the entire contents of which are hereby incorporated by reference.

What is claimed is:

1. A light-emitting device comprising:
   a first electrode, a first light-emitting layer, a second light-emitting layer, a third light-emitting layer and a second electrode in this order; and
   an electron-transport material, a Group 1 metal or a compound of the Group 1 metal, a hole-transport material, and an acceptor which are between the second light-emitting layer and the third light-emitting layer,
   wherein the first light-emitting layer comprises a first host material and a first fluorescent material,
   wherein the second light-emitting layer comprises a second host material, an additive which is configured to form an exciplex together with the second host material, and a phosphorescent material,
   wherein the third light-emitting layer comprises a third host material and a second fluorescent material,
   wherein an emission spectrum peak of the exciplex overlaps with an adsorption band on a longest wavelength side in an absorption spectrum of the phosphorescent material,
   wherein the first fluorescent material and the second fluorescent material are same material,
   wherein a level of the lowest triplet excited state (a T1 level) of the first fluorescent material is higher than a T1 level of the first host material, and
   wherein a level of the lowest singlet excited state (a S1 level) of the first host material is higher than a S1 level of the first fluorescent material.

2. The light-emitting device according to claim 1,
   wherein a level of the lowest triplet excited state (a T1 level) of the second host material is higher than the T1 level of the first host material.

3. The light-emitting device according to claim 1,
   wherein the second host material is any one of a triazole derivative, a dibenzofuran derivative, a pyrimidine derivative, a triazine derivative, a pyridine derivative, a bipyridine derivative, and a phenanthroline derivative.

4. The light-emitting device according to claim 1,
   wherein the first host material is an anthracene derivative or a tetracene derivative.

5. The light-emitting device according to claim 1,
   wherein the first host material and the second host material are same material.

6. The light-emitting device according to claim 1,
   wherein the acceptor is an organic acceptor.

7. A light-emitting device comprising:
   a first electrode, a first light-emitting layer, a second light-emitting layer, a third light-emitting layer and a second electrode in this order; and
   an electron-transport material, a Group 1 metal or a compound of the Group 1 metal, a hole-transport material, and an acceptor which are between the second light-emitting layer and the third light-emitting layer,
   wherein the first light-emitting layer comprises a first host material and a first fluorescent material,
   wherein the second light-emitting layer comprises a second host material, an additive which is configured to form an exciplex together with the second host material, and a phosphorescent material,
   wherein the third light-emitting layer comprises a third host material and a second fluorescent material,
   wherein an emission spectrum peak of the exciplex overlaps with an adsorption band on a longest wavelength side in an absorption spectrum of the phosphorescent material,
   wherein the first host material and the second host material are same material,
   wherein a level of the lowest triplet excited state (a T1 level) of the first fluorescent material is higher than a T1 level of the first host material, and
   wherein a level of the lowest singlet excited state (a S1 level) of the first host material is higher than a S1 level of the first fluorescent material.

8. The light-emitting device according to claim 7, wherein a level of the lowest triplet excited state (a T1 level) of the second host material is higher than the T1 level of the first host material.

9. The light-emitting device according to claim 7, wherein the second host material is any one of a triazole derivative, a dibenzofuran derivative, a pyrimidine derivative, a triazine derivative, a pyridine derivative, a bipyridine derivative, and a phenanthroline derivative.

10. The light-emitting device according to claim 7, wherein the first host material is an anthracene derivative or a tetracene derivative.

11. The light-emitting device according to claim 7, wherein the acceptor is an organic acceptor.

* * * * *